US010848034B2

(12) United States Patent
Purohit et al.

(10) Patent No.: US 10,848,034 B2
(45) Date of Patent: Nov. 24, 2020

(54) CONTROL AND POWER MODULE FOR BRUSHLESS MOTOR

(71) Applicant: Black & Decker Inc., New Britain, CT (US)

(72) Inventors: Madhur M. Purohit, Ellicott City, MD (US); Joshua M. Lewis, Baltimore, MD (US); Marcell E. Coates, Baltimore, MD (US); Michael D. Grove, Windsor, PA (US); Victor A. Dorado, White Marsh, MD (US)

(73) Assignee: Black & Decker Inc., New Britain, CT (US)

( * ) Notice: Subject to any disclaimer, the term of this patent is extended or adjusted under 35 U.S.C. 154(b) by 330 days.

(21) Appl. No.: 15/708,519

(22) Filed: Sep. 19, 2017

(65) Prior Publication Data

US 2018/0084646 A1    Mar. 22, 2018

Related U.S. Application Data

(60) Provisional application No. 62/396,420, filed on Sep. 19, 2016.

(51) Int. Cl.
*H02K 9/22* (2006.01)
*B25F 5/00* (2006.01)
(Continued)

(52) U.S. Cl.
CPC .............. *H02K 9/22* (2013.01); *B25F 5/008* (2013.01); *B25F 5/02* (2013.01); *H02K 5/08* (2013.01);
(Continued)

(58) Field of Classification Search
CPC .......... H02K 7/145; H02K 11/33; H02K 9/06; B25F 5/008; B25F 5/02
See application file for complete search history.

(56) References Cited

U.S. PATENT DOCUMENTS

| 4,649,245 | A | 3/1987 | Lessig, III et al. |
| 4,668,898 | A | 5/1987 | Harms et al. |

(Continued)

FOREIGN PATENT DOCUMENTS

| DE | 10355076 | 6/2005 |
| DE | 102006002491 | 8/2006 |

(Continued)

OTHER PUBLICATIONS

Translation of DE10355076 has been attached.*
(Continued)

*Primary Examiner* — Zoheb S Imtiaz
(74) *Attorney, Agent, or Firm* — Amir Rohani

(57) ABSTRACT

An electronic module is provided for a power tool having an electric motor. The electronic module includes a printed circuit board (PCB) being substantially disc-shaped; power switches mounted on the PCB forming an inverter bridge circuit for driving the electric motor; a controller mounted on the PCB and configured to control a switching operation of the power switches; positional sensors mounted on the PCB substantially equidistantly from a center of the PCB within the control portion and in communication with the controller to provide positional signals related to a rotational position of the electric motor to the controller; and a module housing arranged to receive the PCB therein. The module housing includes a planar portion in parallel to the PCB and openings disposed in the planar portion angularly around a center of the module housing to receive the positional sensors therein.

18 Claims, 20 Drawing Sheets

(51) Int. Cl.

| | | |
|---|---|---|
| *H02K 11/215* | (2016.01) | |
| *H02K 11/33* | (2016.01) | |
| *B25F 5/02* | (2006.01) | |
| *H02K 5/08* | (2006.01) | |
| *H02K 5/22* | (2006.01) | |
| *H02K 7/14* | (2006.01) | |
| *H05K 1/02* | (2006.01) | |
| *H05K 1/11* | (2006.01) | |
| *H05K 1/18* | (2006.01) | |
| *H05K 5/00* | (2006.01) | |
| *H05K 7/20* | (2006.01) | |
| *H05K 3/28* | (2006.01) | |
| *H05K 5/02* | (2006.01) | |
| *H05K 5/06* | (2006.01) | |
| *H05K 7/14* | (2006.01) | |
| *H02K 29/08* | (2006.01) | |

(52) U.S. Cl.
CPC ............... *H02K 5/22* (2013.01); *H02K 5/225* (2013.01); *H02K 7/145* (2013.01); *H02K 11/215* (2016.01); *H02K 11/33* (2016.01); *H05K 1/0203* (2013.01); *H05K 1/115* (2013.01); *H05K 1/181* (2013.01); *H05K 3/284* (2013.01); *H05K 5/0073* (2013.01); *H05K 5/0247* (2013.01); *H05K 5/061* (2013.01); *H05K 7/1427* (2013.01); *H05K 7/209* (2013.01); *H05K 7/2039* (2013.01); *H02K 29/08* (2013.01); *H02K 2203/03* (2013.01); *H02K 2211/03* (2013.01); *H05K 5/0086* (2013.01); *H05K 2201/066* (2013.01); *H05K 2201/09018* (2013.01); *H05K 2201/09036* (2013.01); *H05K 2201/10053* (2013.01); *H05K 2201/10151* (2013.01); *H05K 2201/10166* (2013.01); *H05K 2201/10522* (2013.01)

(56) References Cited

U.S. PATENT DOCUMENTS

| | | | |
|---|---|---|---|
| 4,734,629 A | 3/1988 | Lessig, III et al. | |
| 4,737,661 A | 4/1988 | Lessig, III et al. | |
| 5,006,744 A | 4/1991 | Archer et al. | |
| 5,633,544 A | 5/1997 | Toida et al. | |
| 5,825,107 A | 10/1998 | Johnson et al. | |
| 5,925,948 A | 7/1999 | Matsumoto | |
| 5,932,942 A | 8/1999 | Patyk et al. | |
| 5,939,807 A | 8/1999 | Patyk et al. | |
| 6,424,061 B1 | 7/2002 | Fukuda et al. | |
| 6,490,162 B2 | 12/2002 | Sui | |
| 6,577,030 B2 | 6/2003 | Tominaga et al. | |
| 6,731,503 B2 | 5/2004 | Privett et al. | |
| 6,909,212 B2 | 6/2005 | Uchiyama | |
| 6,920,047 B2 | 7/2005 | Privett et al. | |
| 7,057,317 B2 | 6/2006 | Kuwert | |
| 7,109,625 B1 | 9/2006 | Jore et al. | |
| 7,411,326 B2 | 8/2008 | Achor et al. | |
| 7,638,958 B2 | 12/2009 | Philipp et al. | |
| 7,663,273 B2 | 2/2010 | Shiino et al. | |
| 7,847,457 B2 | 12/2010 | Achor | |
| 7,982,347 B2 | 7/2011 | Shiino et al. | |
| 8,269,380 B2 | 9/2012 | Amaya et al. | |
| 8,291,574 B2 | 10/2012 | Achor | |
| 8,324,769 B2 | 12/2012 | Clendenen | |
| 8,471,418 B2 | 6/2013 | Yamasaki | |
| 8,587,230 B2 | 11/2013 | Pant et al. | |
| 8,587,231 B2 | 11/2013 | Pant | |
| 8,657,482 B2 | 2/2014 | Malackowski et al. | |
| 8,659,194 B2 | 2/2014 | Motoda | |
| 8,674,569 B2 | 2/2014 | Jang et al. | |
| 8,987,964 B2 | 3/2015 | Achor | |
| 9,048,709 B2 | 6/2015 | Chang | |
| 9,059,659 B2 | 6/2015 | Burke | |
| 9,160,211 B2 | 10/2015 | Tanimoto et al. | |
| 9,306,479 B2 | 4/2016 | Chen et al. | |
| 9,318,932 B2 | 4/2016 | Purohit et al. | |
| 9,356,494 B2 | 5/2016 | Motoda et al. | |
| 9,392,732 B2 | 7/2016 | Hara et al. | |
| 9,431,881 B2 | 8/2016 | Clendenen et al. | |
| 9,444,301 B2 | 9/2016 | Jang et al. | |
| 9,450,471 B2 | 9/2016 | Mergener et al. | |
| 2006/0055265 A1 | 3/2006 | Zalusky | |
| 2007/0251473 A1 | 11/2007 | Schafer et al. | |
| 2013/0076174 A1 | 3/2013 | Wibben et al. | |
| 2014/0131059 A1 | 5/2014 | Verbrugge et al. | |
| 2014/0161651 A1 | 6/2014 | Grimes | |
| 2014/0361645 A1 | 12/2014 | Beyerl | |
| 2015/0001972 A1 | 1/2015 | Miyama et al. | |
| 2015/0280517 A1 | 10/2015 | Ekstrom et al. | |
| 2016/0036296 A1 | 2/2016 | Kabune | |
| 2016/0149473 A1 | 5/2016 | Wang et al. | |
| 2016/0181892 A1* | 6/2016 | Purohit | H02K 5/161 310/50 |
| 2016/0218596 A1 | 7/2016 | Hayashi | |
| 2017/0008554 A1 | 1/2017 | Hirotani et al. | |
| 2018/0269750 A1* | 9/2018 | Kobayashi | H02K 9/28 |

FOREIGN PATENT DOCUMENTS

| | | | |
|---|---|---|---|
| DE | 10355076 | * | 6/2009 |
| DE | 102006002491 | * | 8/2010 |
| DE | 102011005058 | | 9/2012 |
| DE | 102011110971 | | 1/2013 |
| DE | 202015005110 | | 9/2015 |
| DE | 102015214463 | | 2/2016 |
| EP | 0884828 | | 1/2006 |
| EP | 1826888 | | 8/2007 |
| EP | 2113992 | | 11/2009 |
| EP | 2571147 | | 3/2013 |
| EP | 2634066 | | 9/2013 |
| EP | 3065269 | | 9/2016 |
| JP | H0823666 | | 1/1996 |
| JP | H1098853 | | 4/1998 |
| JP | 2008178190 | | 7/2008 |
| WO | 8807285 | | 9/1988 |
| WO | 0001054 | | 1/2000 |
| WO | 0004290 | | 1/2000 |
| WO | 2007004429 | | 1/2007 |
| WO | 2009145205 | | 12/2009 |
| WO | 2016105660 | | 6/2016 |

OTHER PUBLICATIONS

Translation of DE102006002491has been attached.*
Extended EP Search Report dated Feb. 12, 2018 issued in corresponding EP Application No. 17191891.5.
Extended EP Search Report dated Feb. 12, 2018 issued in corresponding EP Application No. 17191894.9.
EP Communication Article 94(3) EPC, dated Jan. 3, 2019 issued in corresponding EP application No. 17191894.9.

* cited by examiner

CONTROL AND POWER MODULE FOR BRUSHLESS MOTOR

RELATED APPLICATION

This application claims the benefit of U.S. Provisional Application No. 62/396,420 filed June Sep. 19, 2016, which is incorporated herein by reference in its entirety.

FIELD

This disclosure relates to brushless motor controls. More particularly, the present invention relates to a module including control and power circuitry for driving a brushless motor.

BACKGROUND

Brushless DC (BLDC) motors have been used in recent years in various cordless power tools. While BLDC motors provide many advantages over universal and permanent magnet DC motors, challenges exist in incorporating BLDC motors into many power tools depending on power requirements and specific applications of tool.

To drive a BLDC motor, a series of power switching components are typically provided to control the flow of current to the motor windings. These power switching components generate significant amount of heat. Thermal control of such components generally presents many challenges, particularly in compact power tool applications. This is particularly true for tools used in environments where dust and particulate from the workpiece is abundant, making it difficult to create a clean air flow within the tool to cool both the motor and the power switching components.

The power switching components are controlled via a micro-controller or other control hardware. The micro-controller also receives positional signals related to the rotational position of the motor from a series of sensors (e.g., Hall sensors). The wiring connectivity between the micro-controller, the power switching components, and the positional sensors is often burdensome and susceptible to failure. Again such failures are more abundant in power tools used in harsh environments where dust and vibration can interfere with or break the electrical connections.

SUMMARY

According to an embodiment of the invention, an electronic module is provided for a power tool having an electric motor. In an embodiment, the electronic module includes a printed circuit board (PCB) having a first surface and a second surface; first (high-side) power switches mounted on the first surface of the PCB; second (low-side) power switches mounted on the PCB and electrically coupled to the first power switches forming an inverter bridge circuit for driving the electric motor; a first heat sink surface-mounted on the first surface of the PCB and having a planar main body disposed over the first power switches; a module housing arranged to receive the PCB therein; and a second heat sink secured to the module housing in thermal communication with the first heat sink to transfer heat from the first power switches.

In an embodiment, each of the second power switches is mounted on the second surface the PCB substantially opposite a respective first power switch.

In an embodiment, a first set of conductive tracks is disposed on the first surface of the PCB and electrically coupled to drains of the first power switches, and a second set of conductive tracks is disposed on the second surface of the PCB and electrically coupled to sources of the second power switches.

In an embodiment, the PCB includes through-holes between the first and second sets of conductive tracks, and power terminals each having legs received within the through-holes to electrically connect the corresponding conductive tracks.

In an embodiment, each power terminal includes a radial peripheral slot arranged to receive and make electrical contact with a corresponding motor terminal.

In an embodiment, peripheral slots are disposed around the PCB for pass-through of the motor terminals.

In an embodiment, positional sensors are disposed angularly around a center of the first surface of the PCB.

In an embodiment, the module housing includes a planar portion, and a plurality of openings disposed in the planar portion angularly around a center of the module housing and corresponding to the positional sensors.

In an embodiment, the module housing includes a casing molded around the second heat sink.

In an embodiment, the second heat sink includes a ring-shaped or a C-shaped profile.

In an embodiment, the second heat sink has a surface area that is two to four times larger than a surface area of the first heat sink.

In an embodiment, a first surface of the second heat sink is positioned in contact with or in close proximity to the planar main body of the first heat sink, and a second surface of the second heat sink is at least partially exposed on an outer portion of the module housing facing the electric motor.

In an embodiment, the module housing and the PCB each includes a through-hole arranged to receive a shaft of the electric motor.

In an embodiment, the first power switches are disposed on one side of the first surface of the PCB.

According to an embodiment of the invention, an electronic module is provided for a power tool having an electric motor. In an embodiment, the electronic module includes a printed circuit board (PCB) being substantially disc-shaped and including a first surface and a second surface, where the first surface has a power portion and a control portion and a second surface. In an embodiment, the electronic module further includes first (high-side) power switches mounted on the first surface of the PCB within the power portion; second (low-side) power switches mounted on the PCB and electrically coupled to the first power switches forming an inverter bridge circuit for driving the electric motor; a heat sink having legs mounted on the first surface of the PCB and having a planar main body extending from the legs substantially in parallel to the of the PCB over the first power switches; a controller mounted on the PCB and configured to control a switching operation of the first power switches and the second power switches; and positional sensors mounted on the first surface of the PCB substantially equidistantly from a center of the PCB within the control portion in communication with the controller to provide positional signals related to a rotational position of the electric motor to the controller.

In an embodiment, the controller is mounted on the first surface of the PCB within the control portion.

In an embodiment, the first power switches are disposed equidistantly from the center of the PCB. In an embodiment, the first power switches are disposed at an angular distance of approximately 60 degrees apart.

In an embodiment, power terminals are disposed around a periphery of the PCB and angularly corresponding to the power switches. In an embodiment, the power terminals are disposed to receive motor terminals therein to electrically connect the first power switches to the electric motor.

In an embodiment, a module housing is arranged to receive the PCB therein. In an embodiment, the module housing includes a planar portion in parallel to the PCB and openings disposed in the planar portion angularly around a center of the module housing to receive the positional sensors therein.

In an embodiment, a gasket is disposed between the planar portion of the module housing and the first surface of the PCB to seal the outer perimeters of the openings.

In an embodiment, the module housing includes a heat sink in thermal communication with the first power switches. In an embodiment, the heat sink is exposed on an outer surface of the module housing facing the motor.

In an embodiment, the heat sink includes a ring-shaped or a C-shaped profile.

In an embodiment, a potting compound is provided to substantially cover both surfaces of the PCB within the module housing.

According to an embodiment of the invention, an electronic module is provided for a power tool having an electric motor. In an embodiment, the electronic module includes a printed circuit board (PCB) being substantially disc-shaped; power switches mounted on the PCB forming an inverter bridge circuit for driving the electric motor; a controller mounted on the PCB and configured to control a switching operation of the power switches; positional sensors mounted on the PCB substantially equidistantly from a center of the PCB within the control portion and in communication with the controller to provide positional signals related to a rotational position of the electric motor to the controller; and a module housing arranged to receive the PCB therein. In an embodiment, the module housing includes a planar portion in parallel to the PCB and openings disposed in the planar portion angularly around a center of the module housing to receive the positional sensors therein.

In an embodiment, a first heat sink is mounted on the PCB in thermal communication with at least one of the power switches.

In an embodiment, a second heat sink is secured to the module housing in thermal communication with the first heat sink to transfer heat from the power switches.

According to an embodiment of the invention, a power tool is provided including a housing arranged to house the electric motor. An electronic module having the features described above is disposed within the housing adjacent the motor.

BRIEF DESCRIPTION OF THE DRAWINGS

The drawings described herein are for illustration purposes only and are not intended to limit the scope of this disclosure in any way.

Corresponding reference numerals indicate corresponding parts throughout the several views of the drawings.

DETAILED DESCRIPTION

Figure 1:
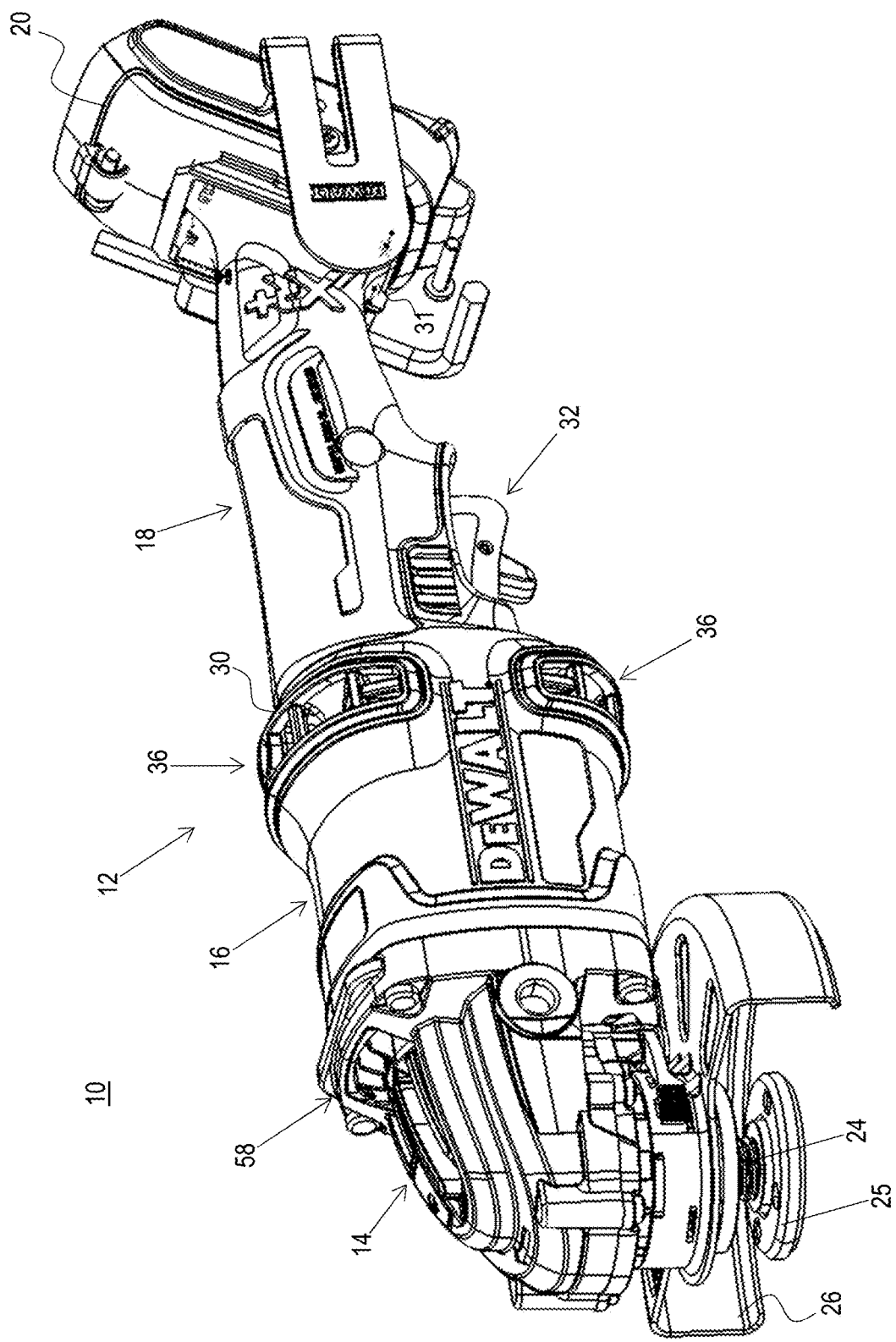
FIG. 1 depicts a perspective view of an exemplary power tool, according to an embodiment of the invention.

The following description illustrates the claimed invention by way of example and not by way of limitation. The description clearly enables one skilled in the art to make and use the disclosure, describes several embodiments, adaptations, variations, alternatives, and uses of the disclosure, including what is presently believed to be the best mode of carrying out the claimed invention. Additionally, it is to be understood that the disclosure is not limited in its application to the details of construction and the arrangements of components set forth in the following description or illustrated in the drawings. The disclosure is capable of other embodiments and of being practiced or being carried out in various ways. Also, it is to be understood that the phraseology and terminology used herein is for the purpose of description and should not be regarded as limiting.

Figure 2:
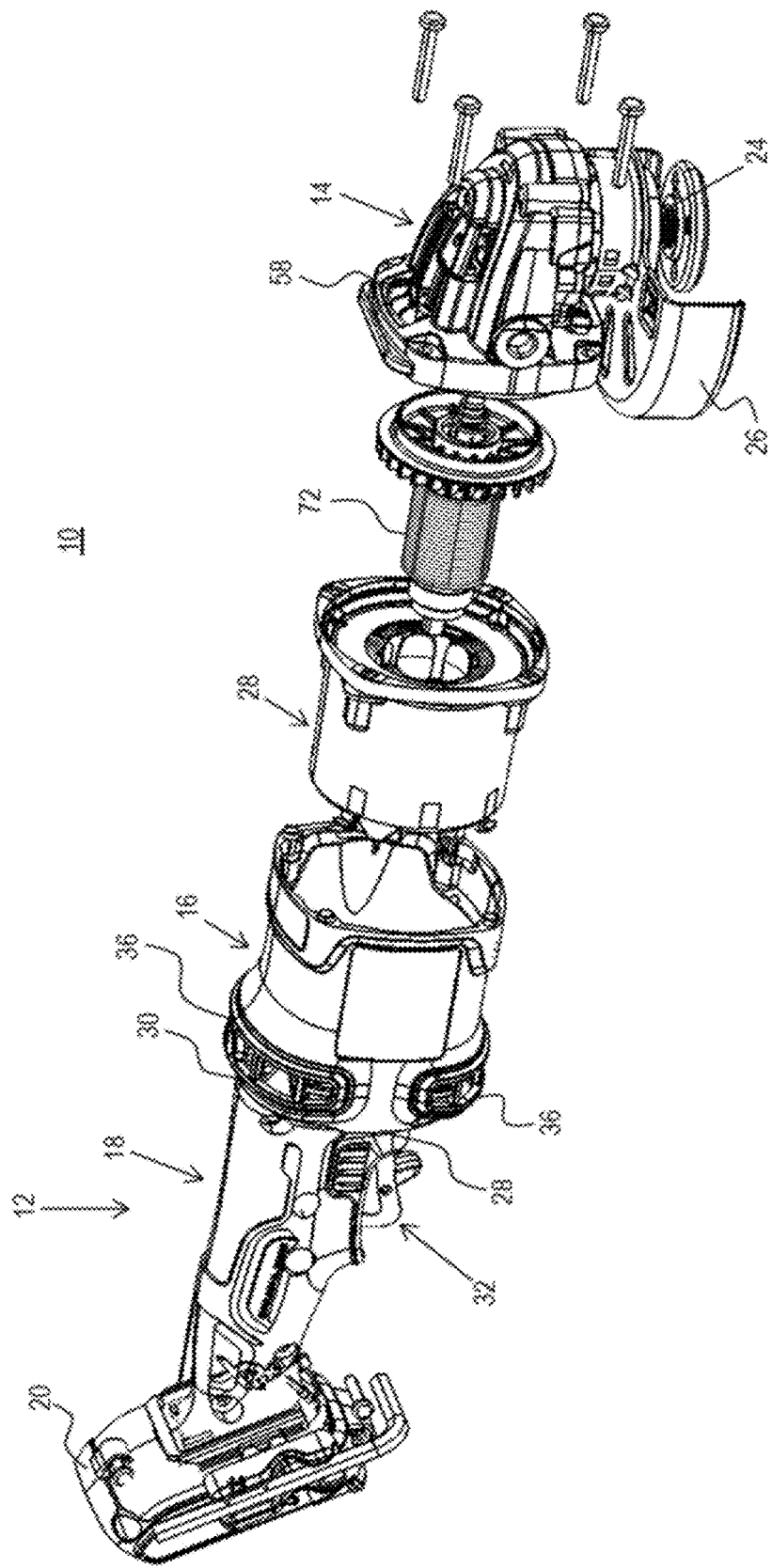
FIGS. 2 and 3 depict perspective exploded views of the exemplary power tool, according to an embodiment of the invention.
Figure 3:
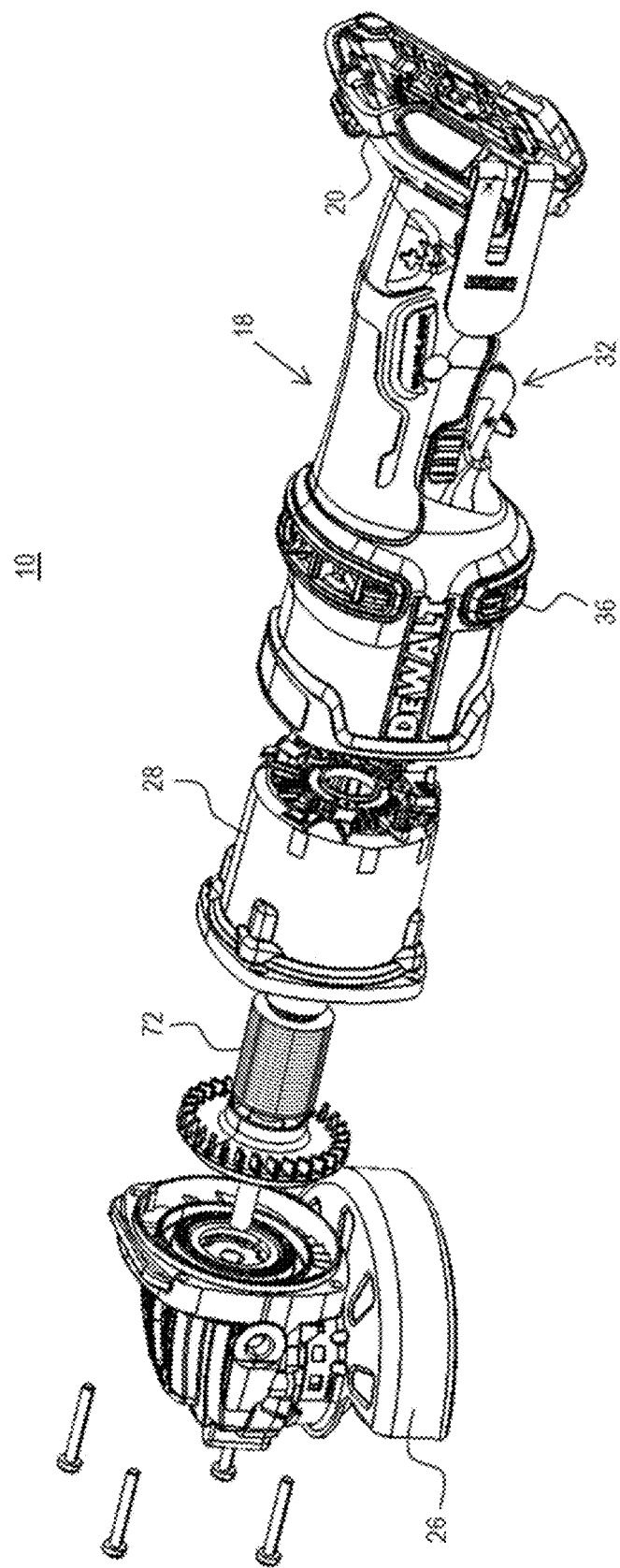

As shown in FIGS. 1-3, according to an embodiment of the invention, a power tool 10 is provided including a housing 12 having a gear case 14, a motor case 16, a handle portion 18, and a battery receiver 20. FIG. 1 provides a perspective view of the tool 10. FIGS. 2 and 3 depict two exploded views of tool 10. Power tool 10 as shown herein is an angle grinder with the gear case 14 housing a gear set (not shown) that drives a spindle 24 arranged to be coupled to a grinding or cutting disc (not shown) via a flange (or threaded nut) 25 and guarded by a disc guard 26. It should be understood, however, that the teachings of this disclosure may apply to any other power tool including, but not limited to, a saw, drill, sander, and the like.

In an embodiment, the motor case 16 attaches to a rear end of the gear case 14 and houses a motor 28 operatively connected to the gear set 22. The handle portion 18 attaches to a rear end 30 of the motor case 16 and includes a trigger assembly 32. The battery receiver 20 extends from a rear end 31 of the handle portion 18 for detachable engagement with a battery pack (not shown) to provide power to the motor 28. In an exemplary embodiment, the battery pack may be a 60 volt max lithium-ion type battery pack, although battery packs with other battery chemistries, shapes, voltage levels, etc. may be used in other embodiments.

In various embodiments, the battery receiver 20 and battery pack may be a sliding pack disclosed in U.S. Pat. No. 8,573,324, hereby incorporated by reference. However, any suitable battery receiver and battery back configuration, such as a tower pack or a convertible 20V/60V battery pack as disclosed in U.S. patent application Ser. No. 14/715,258 filed May 18, 2015, also incorporated by reference, can be used. The present embodiment is disclosed as a cordless, battery-powered tool. However, in alternate embodiments power tool can be corded, AC-powered tools. For instance, in place of the battery receiver and battery pack, the power tool 10 include an AC power cord coupled to a transformer block to condition and transform the AC power for use by the components of the power tools. Power tool 10 may for example include a rectifier circuit adapted to generate a positive current waveform from the AC power line. An example of such a tool and circuit may be found in US Patent Publication No. 2015/0111480, filed Oct. 18, 2013, which is incorporated herein by reference in its entirety.

In an embodiment, the trigger assembly 32 is a switch electrically connected to the control module 11 as discussed above. The trigger assembly 32 in this embodiment is an ON/OFF trigger switch pivotally attached to the handle 18. The trigger 32 is biased away from the handle 18 to an OFF position. The operator presses the trigger 32 towards the handle to an ON position to initiate operation of the power tool 10. In various alternate embodiments, the trigger assembly 32 can be a variable speed trigger switch allowing the operator to control the speed of the motor 28 at no-load, similar to variable-speed switch assembly disclosed in U.S. Pat. No. 8,573,324, hereby incorporated by reference. However, any suitable input means can be used including, but not limited to a touch sensor, a capacitive sensor, or a speed dial.

In an embodiment, power tool 10 described herein is high-power power tool configured to receive a 60V max battery pack or a 60V/20V convertible battery pack configured in its 60V high-voltage-rated state. The motor 28 is accordingly configured for a high-power application with a stator stack length of approximately 30 mm. Additionally, as later described in detail, the power module 34, including its associated heat sink, is located within the motor case 16 in the vicinity of the motor 28. Additionally and/or alternatively, power tool 10 may be have a low-voltage rating (e.g., 20V) or mid-voltage rating (e.g., 40V) adapted to receive a 20V max or a 40V max battery pack.

While embodiments depicted herein relate to a DC-powered power tool powered by a battery pack, it is noted that the teachings of this disclosure also apply to an AC-powered tool, as disclosed in US Patent Publication No. 2015/0111480, which is incorporated herein by reference in its entirety. In this embodiment, a power cord may be provided instead of battery receiver 20. The power tool 10 may be configured to receive AC supply having a nominal voltage of, for example, 120 VAC. Alternatively, power tool 10 may be configured to receive AC supply having a nominal voltage of, for example, 230 VAC.

Additionally and/or alternatively, the teachings of this disclosure also apply to an AC/DC power tool, as disclosed in WO2015/179318 filed May 18, 2015, which is incorporated herein by reference in its entirety. In this case, the power tool may be provided with a battery receptacle 20 as well as a power cord (not shown). Alternatively, an AC/DC power adaptor may be provided to supply one of AC or DC power to the power tool via the battery receiver 20, as described in detail in the '318 application.

Figure 4:
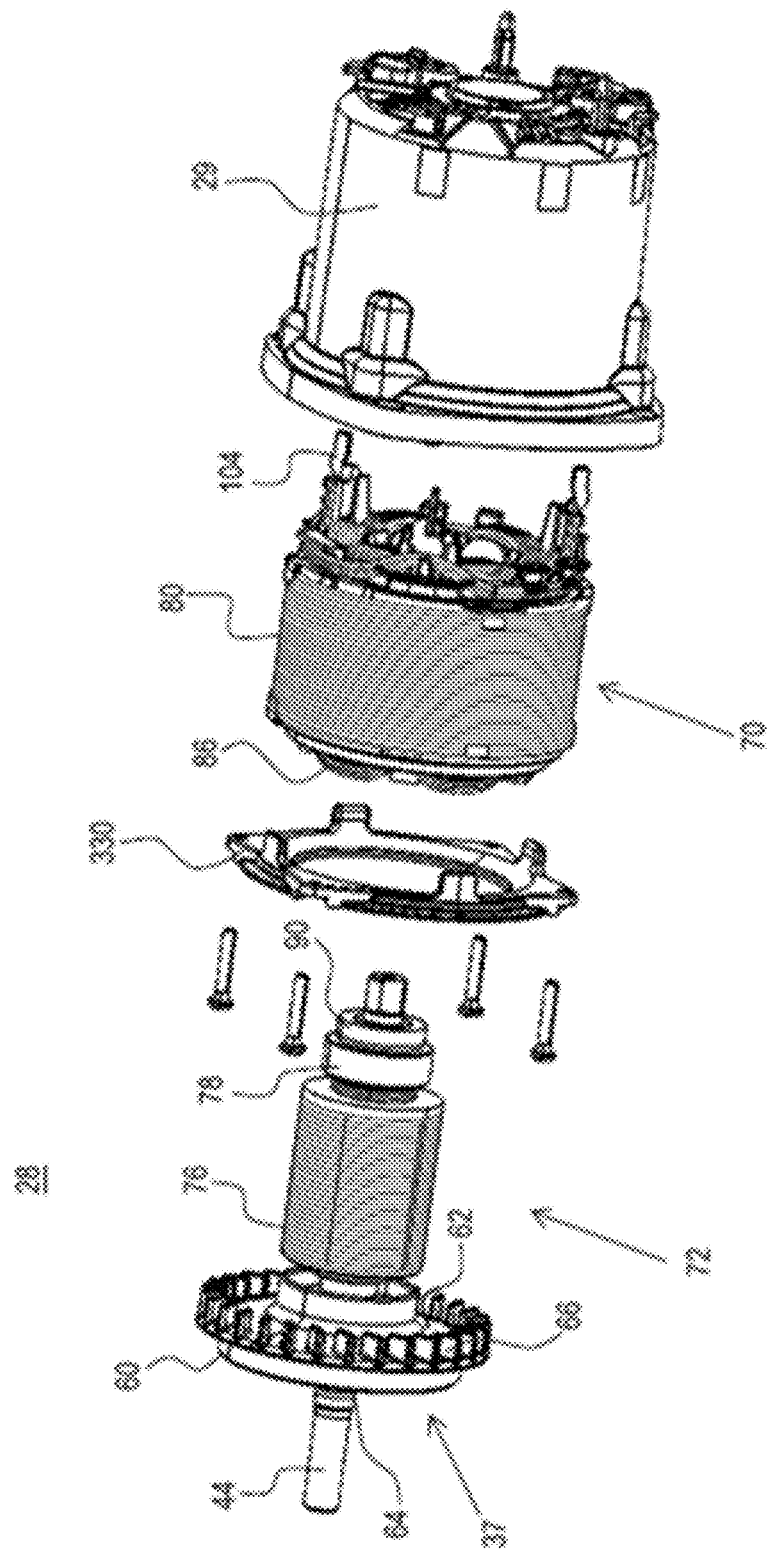
FIG. 4 depicts a perspective exploded view of a brushless DC (BLDC) motor disposed within the power tool, according to an embodiment of the invention.

FIG. 4 depicts an exploded view of the motor 28, according to an embodiment. As shown herein, the motor 28 is a three-phase brushless DC (BLDC) motor having a can or motor housing 29 sized to receive a stator assembly 70 and a rotor assembly 72. Various aspects and features of the motor 28 are described herein in detail. It is noted that while motor 28 is illustratively shown as a part of an angle grinder, motor 28 may be alternatively used in any power tool or any other device or apparatus.

In an embodiment, rotor assembly 72 includes a rotor shaft 74, a rotor lamination stack 76 mounted on and rotatably attached to the rotor shaft 74, a rear bearing 78 arranged to axially secure the rotor shaft 74 to the motor housing 29, a sense magnet ring 90 attached to a distal end of the rotor shaft 74, and fan 37 also mounted on and rotatably attached to the rotor shaft 74. In various implementations, the rotor lamination stack 76 can include a series of flat laminations attached together via, for example, an interlock mechanical, an adhesive, an overmold, etc., that house or hold two or more permanent magnets (PMs) therein. The permanent magnets may be surface mounted on the outer surface of the lamination stack 76 or housed therein. The permanent magnets may be, for example, a set of four PMs that magnetically engage with the stator assembly 70 during operation. Adjacent PMs have opposite polarities such that the four PMs have, for example, an N—S—N—S polar arrangement. The rotor shaft 74 is securely fixed inside the rotor lamination stack 76. Rear bearing 78 provide longitudinal support for the rotor 74 in a bearing pocket (described later) of the motor housing 29.

In an embodiment, stator assembly 70 includes a generally cylindrical lamination stack 80 having center bore configured to receive the rotor assembly 72. Lamination stack 80 further includes a plurality of stator teeth extending inwardly from a stator ring towards the center bore. The stator teeth define a plurality of slots there between configured. A plurality of coil windings 86 are wound around the stator teeth 82 into the slots. Coil windings 86 may be wound and connected together in various configurations, e.g., in a wye or a delta configuration. In an embodiment, where motor 28 is a three-phase BLDC motor, three coil windings 86 may be wound on six stator teeth 82, with each coil winding 86 being wound on two opposing teeth 82 (e.g., U and U', V and V', and W and W'). Terminals 104 are coupled to the coil windings 86. In an embodiment, the location of two opposing coils (e.g., W and W') may be switched and the stator routed accordingly in order to provide the three terminals 110 at 60 degrees apart.

In an embodiment, fan 37 of the rotor assembly 72 includes a back plate 60 having a first side 62 facing the motor case 16 and a second side 64 facing the gear case 14. A plurality of blades 66 extend axially outwardly from first side 62 of the back plate 60. Blades 64 rotate with the rotor shaft 44 to generate an air flow as previously discussed. When motor 28 is fully assembled, fan 37 is located at or outside an open end of the motor housing 28 with a baffle 330 arranged between the stator assembly 70 and the fan 37. The baffle 33 guides the flow of air from the blades 64 towards the exhaust vents 58.

The operation of a BLDC motor is typically controlled via a power module including a series of semiconductor switches (e.g., FETs or IGBTs) configured as a three-phase inverter circuit and provided between the power supply and the motor, and a control module including a microcontroller that manages motor commutation by controlling the switching operation of the power module switches. The control module may be coupled to the trigger switch (or other variable-speed input unit) to regulate the amount of current being supplied to the motor from the power source by controlling a pulse-width-modulate (PWM) duty cycle of the power module switches. The control module is also coupled to a series of positional sensors (e.g., Hall sensors) provided in close proximity to the motor sense magnet ring 90.

Figure 5:
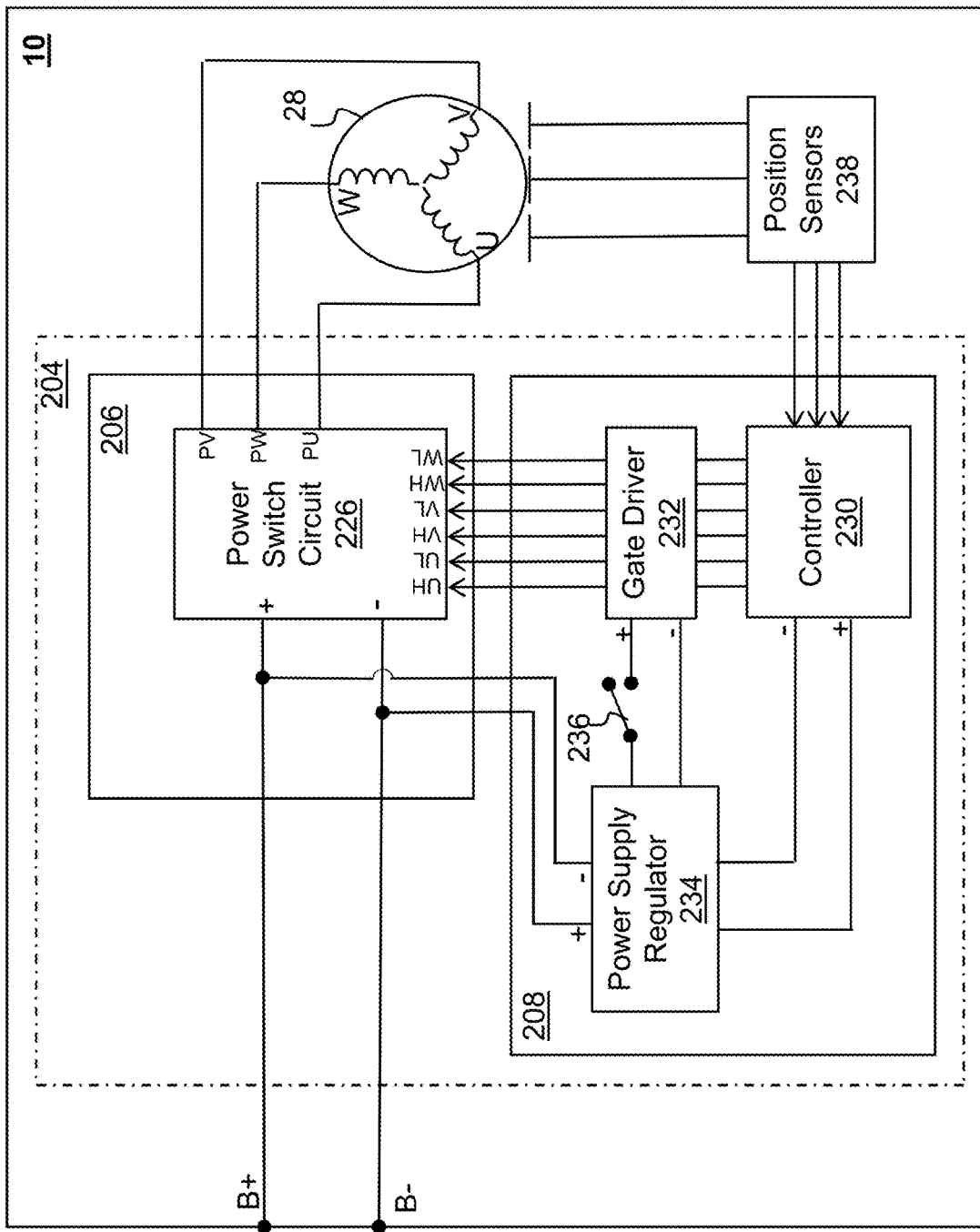
FIG. 5 depicts an exemplary circuit block diagram for a battery-powered power tool including a motor control circuit, according to an embodiment.

Referring to FIG. 5, a circuit block diagram of power tool 10 including a motor 28 and a motor control circuit 204 is depicted, according to an embodiment. In an embodiment, motor control circuit 204 includes a power unit 206 and a control unit 208. In FIG. 5, power tool 10 received DC power from a DC power source such as a battery pack via B+ and B− terminals.

In an embodiment, power unit 206 may include a power switch circuit 226 coupled between the power source B+/B− terminals and motor windings to drive BLDC motor 28. In an embodiment, power switch circuit 226 may be a three-phase bridge driver circuit including six controllable semiconductor power devices (e.g. FETs, BJTs, IGBTs, etc.).

In an embodiment, control unit 208 may include a controller 230, a gate driver 232, a power supply regulator 234, and a power switch 236. In an embodiment, controller 230 is a programmable device arranged to control a switching operation of the power devices in power switching circuit 226. In an embodiment, controller 230 receives rotor rotational position signals from a set of position sensors 238 provided in close proximity to the motor 28 rotor. In an embodiment, position sensors 238 may be Hall sensors. It should be noted, however, that other types of positional sensors may be alternatively utilized. Controller 230 may also receive a variable-speed signal from variable-speed actuator or a speed-dial. Based on the rotor rotational position signals from the position sensors 238 and the variable-speed signal, controller 230 outputs drive signals UH, VH, WH, UL, VL, and WL through the gate driver 232, which provides a voltage level needed to drive the gates of the semiconductor switches within the power switch circuit 226 in order to control a PWM switching operation of the power switch circuit 226.

In an embodiment, power supply regulator 234 may include one or more voltage regulators to step down the power supply to a voltage level compatible for operating the controller 230 and/or the gate driver 232. In an embodiment, power supply regulator 234 may include a buck converter and/or a linear regulator to reduce the power voltage of power supply interface 128-5 down to, for example, 15V for powering the gate driver 232, and down to, for example, 3.2V for powering the controller 230.

In an embodiment, power switch 236 may be provided between the power supply regulator 234 and the gate driver 232. Power switch 236 may be an ON/OFF switch coupled to the ON/OFF trigger or the variable-speed actuator to allow the user to begin operating the motor 28, as discussed above. Power switch 236 in this embodiment disables supply of power to the motor 28 by cutting power to the gate drivers 232. It is noted, however, that power switch 236 may be provided at a different location, for example, within the power unit 206 between the rectifier circuit 220 and the power switch circuit 226. It is further noted that in an embodiment, power tool 128 may be provided without an ON/OFF switch 236, and the controller 230 may be configured to activate the power devices in power switch circuit 226 when the ON/OFF trigger (or variable-speed actuator) is actuated by the user.

Figure 6:
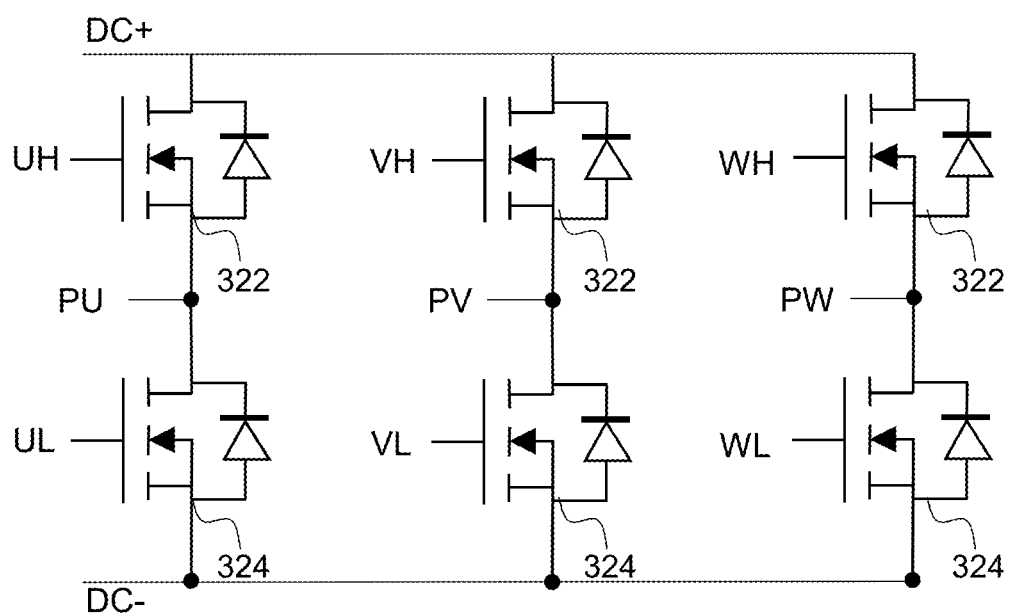
FIG. 6 depicts an exemplary circuit diagram of an three-phase inverter circuit for driving a BLDC motor, according to an embodiment.

FIG. 6 depicts an exemplary power switch circuit 226 having a three-phase inverter bridge circuit, according to an embodiment. As shown herein, the three-phase inverter bridge circuit includes three high-side FETs and three low-side FETs. The gates of the high-side FETs driven via drive signals UH, VH, and WH, and the gates of the low-side FETs are driven via drive signals UL, VL, and WL. In an embodiment, the drains of the high-side FETs are coupled to the sources of the low-side FETs to output power signals PU, PV, and PW for driving the BLDC motor 28.

In conventional designs, the power unit is provided on a printed circuit board (PCB) located in the handle portion of the tool or in a location close to the motor. The control unit is often provided on a separate PCB in the handle portion in close proximity to the trigger switch or the power supply interface. The positional sensors are often provided on yet another PCB in close proximity to the motor sense magnet ring.

Designs have been proposed in recent years combining one or more of these modules as a part of a single package. For example, designs have been proposed to combine the power unit and the positional sensors on a single PCB. However, it has not been possible to provide a single package including the power unit, the control unit, and the positional sensors, utilizing a single PCB, for many power tool applications. Specifically, ergonomics requirements of compact handheld power tools such as small angle grinders, combined with the high amount of heat produced by semiconductor switching components of the power module, presents many challenges to a single module approach. Embodiments of the invention described herein overcome these challenges.

U.S. patent application Ser. No. 14/973,226, filed Dec. 17, 2015, which is incorporated herein by reference in its entirety, discloses a control and power module for a power tool having a brushless DC motor, where the control and power module includes a printed circuit board (PCB), a power unit having an inverter bridge circuit with three pairs of power switches mounted on both sides of the PCB opposite one another, and a control unit including a microcontroller also disposed on the PCB. The present disclosure provides an improved and/or alternative control and power module with certain advantages described herein.

Figure 7A:
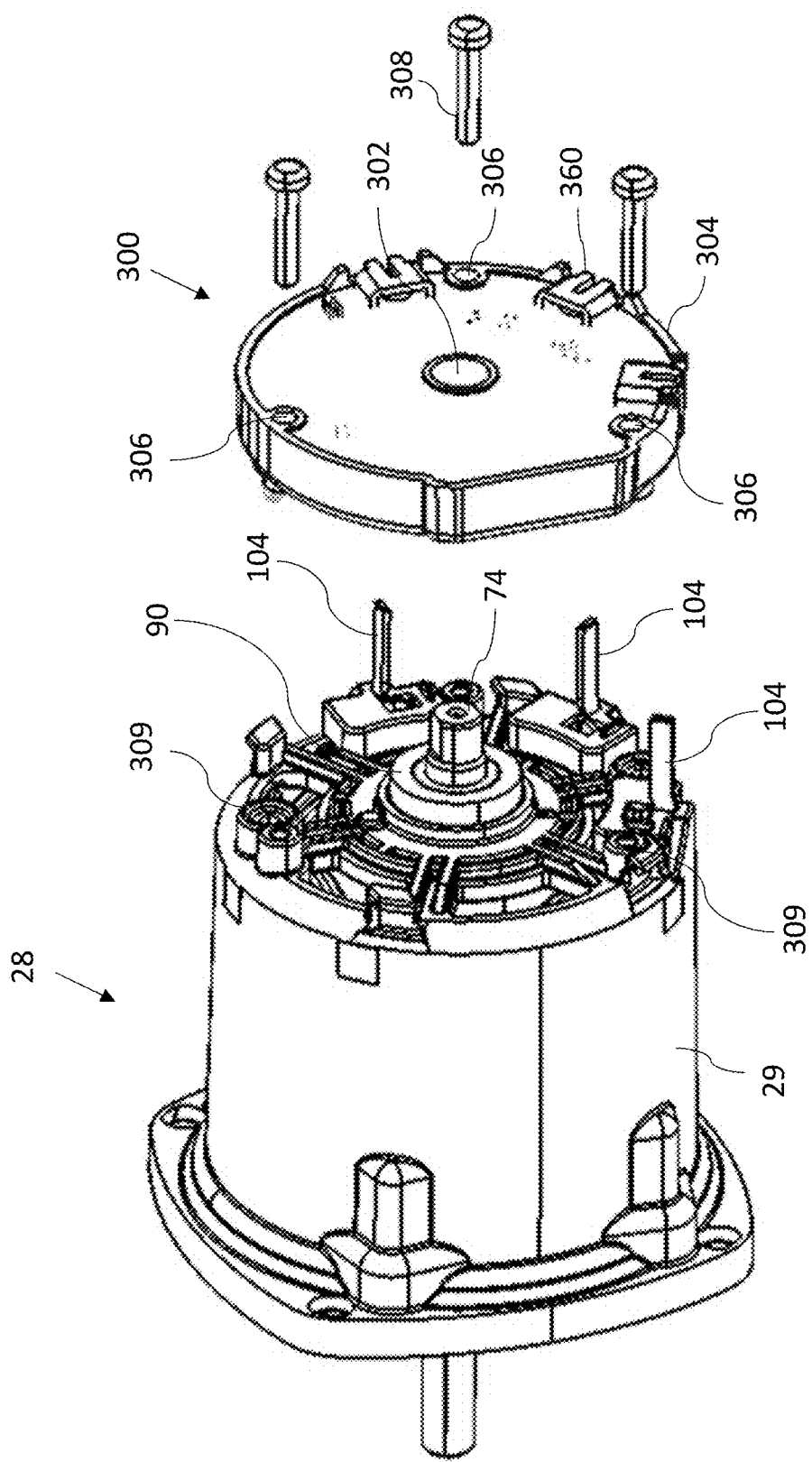
FIG. 7A depicts a partially-exploded view of the BLDC motor and a combined control and power module provided adjacent the end of the motor, according to an embodiment.
Figure 7B:
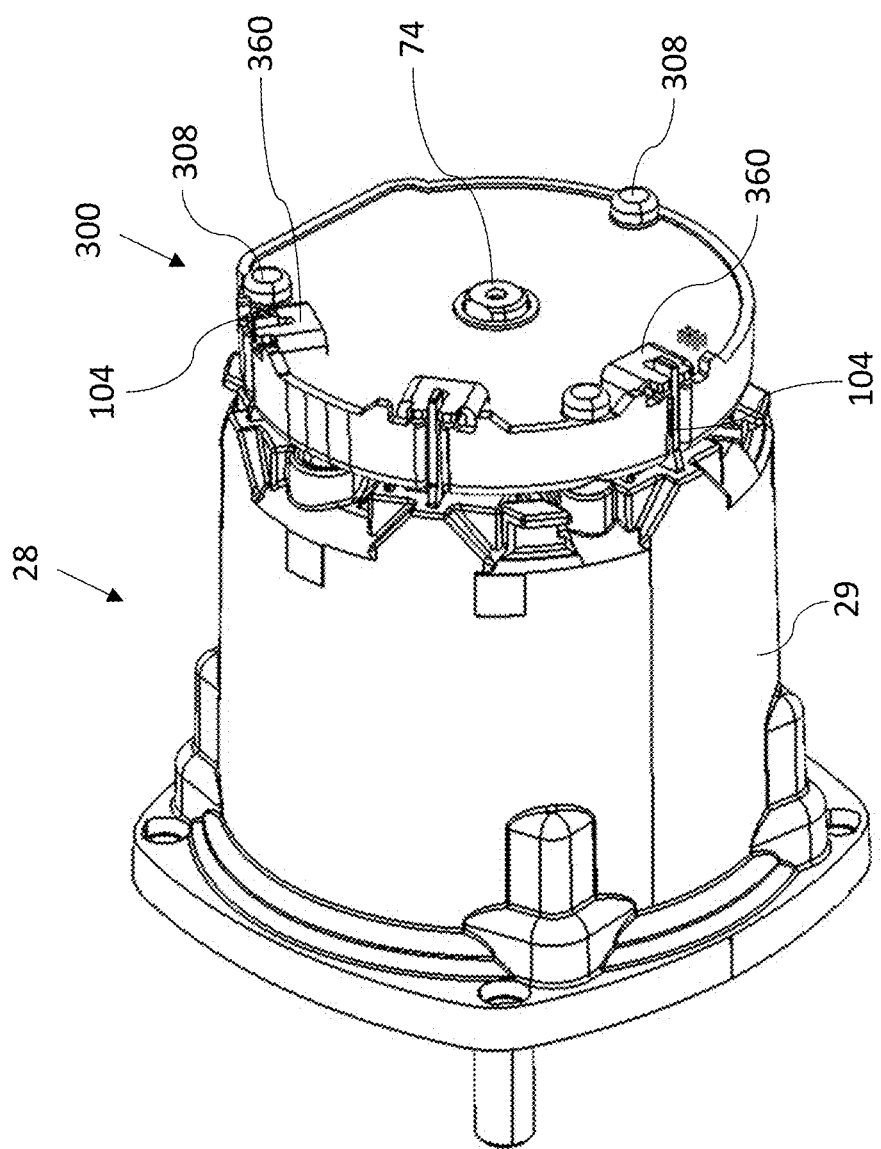
FIG. 7B depicts a perspective view of the BLDC motor and the combined control and power module provided adjacent the end of the motor, according to an embodiment.

Referring to the partially-exploded view of FIG. 7A and the perspective view of FIG. 7B, a combined control and power module 300 is provided adjacent the end of the motor 28, according to an embodiment. In an embodiment, module 300 includes a through-hole 302 formed in a module housing 304 that receives an end of the motor shaft 74 therein when the module 300 is mounted to the end of the motor 28. In an embodiment, module 300 further includes a series of motor terminals 360 that receive and electronically coupled with motor terminals 104 therein when the module 300 is mounted to the end of the motor 28. A series of fasteners 308 are received in corresponding through-holes 306 in module 300 and corresponding receptacles 309 at the end of the motor housing 29 to securely hold the module 300 to the end of the motor 28.

The detailed features of combined control and power module 300 are described herein with reference to FIGS. 8A through 17, according to an embodiment.

Figure 8A:
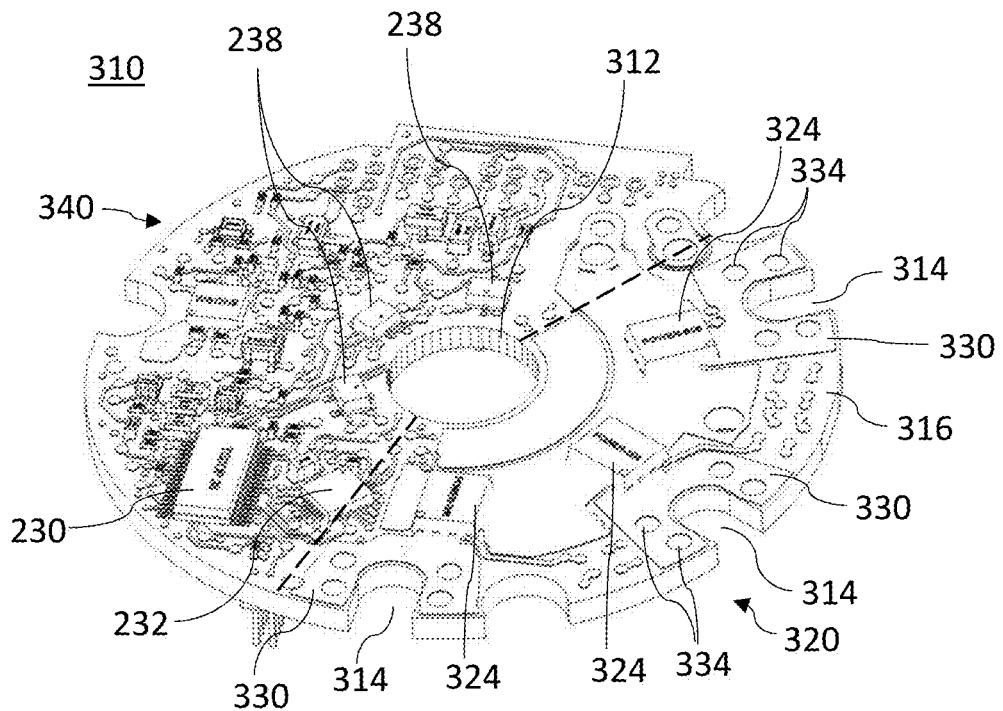
FIGS. 8A and 8B depict front and back perspective views of a printed circuit board (PCB) for use in the control and power module, according to an embodiment.
Figure 8B:
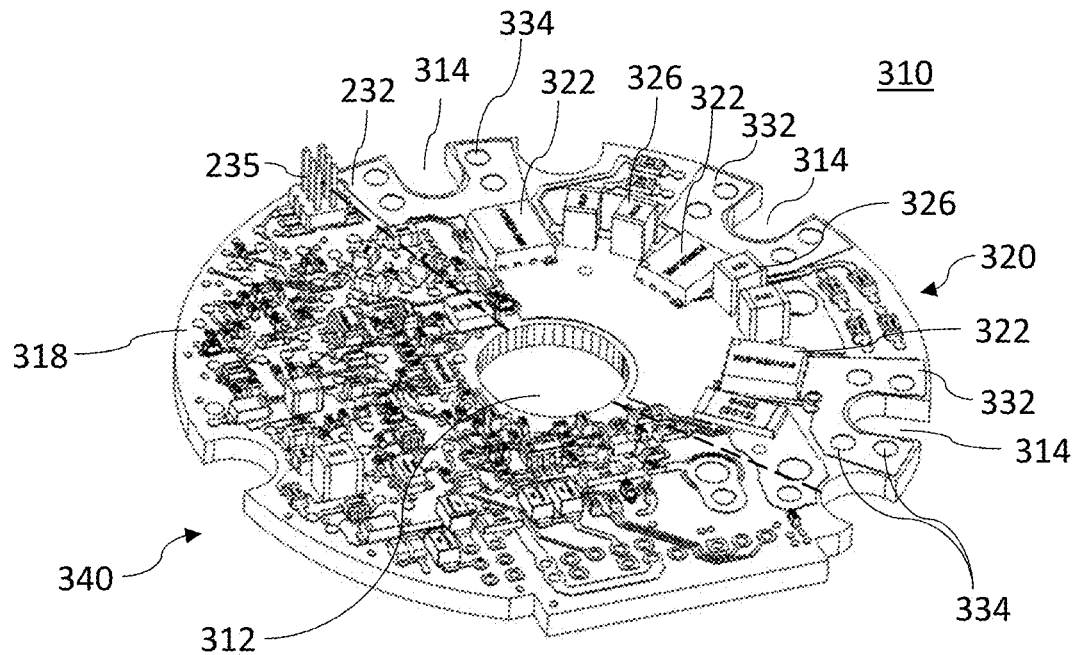

FIGS. 8A and 8B depict front and back perspective views of a printed circuit board (PCB) 310 for use in the control and power module 300, in an embodiment. In an embodiment, PCB 310 is generally disc-shape including a through-hole 312 corresponding to through-hole 302 of module 300 for longitudinally receiving the motor shaft 74, and a series of peripheral slots 314 for longitudinally receiving motor terminals 104. FIG. 8A depicts a first surface 316 of the PCB 310 and FIG. 8B depicts a second surface 318 of the PCB 310 opposite the first surface 316. In an embodiment, the area of the PCB 310 each surface is generally divided to a power portion 320 and a control portion 340 as indicated by dashed lines in these figures.

In an embodiment, power portion 320 includes a series of high-side switches 322 mounted on the second surface 318 and a series of low-side switches 324 mounted on the first surface 316 in mirror opposite of the high-side switches 322. The high-side and low-side switches 322 and 324 may be, for example, n-channel field-effect transistors (FETs), which generate a relatively low amount of heat. Such switches are suitable for most power tool applications with a power supply in the range of 10 to 60V average voltage. It must be understood, however, that other types of semiconductor switches such as low-heat IGBTs may be alternatively utilizes for higher power applications. The circuit connection for these high-side and low-side switches 322 and 326 was described above with reference to FIG. 6. In an embodiment, a series of high-side bootstrap capacitors 326 and associated circuitry is also mounted on the second surface 318 for driving the gates of the high-side switches 322.

In an embodiment, the high-side and low-side switches 322 and 324 are disposed in close proximity to the slots 314, at approximately equal distances from the through-hole 312, e.g., radially between the slots 314 and the through-hole 312 around a circle. In an embodiment, the respective high-side switches 322 are disposed at an angular distance of approximately 60 degrees apart, and the respective low-side switches 324 are similarly disposed at an angular distance of approximately 60 degrees apart.

In an embodiment, a series of first terminal conductive tracks 330 are disposed on the first surface 316 around the slots 314. Similarly, a series of second terminal conductive tracks 332 are disposed on the second surface 318 opposite conductive tracks 330 and around the slots 314. A series of through-holes 334 (in this example four through-holes per slot) is disposed around each slot 314 through the first and second conductive tracks 330 and 332.

In an embodiment, the drains of the low-side switches 324 are connected to the corresponding first conductive tracks 330. Similarly, the sources of the high-side switches 322 are electrically connected to the corresponding second conductive tracks 332. In an embodiment, as will be discussed later, power terminals electronically connect the first and second conductive tracks 330 and 332 through the through-holes 334. This connection provides the electrical coupling between the motor phases (PU, PV, and PW in FIG. 6) and the corresponding high-side and low-side switches 322 and 324. Additionally and/or alternatively, in an embodiment, through-holes 334 are vias that provide the electrical connection between the first and second conductive tracks 330 and 332.

In an embodiment, the drains of the high-side switches 322 and the sources of the low-side switches 324 are electrically coupled to the power supply (e.g., the B+ and B− nodes of the battery pack).

In an embodiment, control portion 340 includes controller 230, which may be a micro-controller or other programmable control unit, mounted on the first surface 316 of the PCB 310. Gate driver chip 232 is similarly mounted on the first surface 316 of the PCB 310. The gate driver 232 is electrically coupled to the gates of the high-side and low-side switches 322 and 324. Other control circuitry such as power supply regulator 234 components, control circuitry for on/off or speed control, etc. are also mounted with the control portion 340 on either surface of the PCB 310.

In an embodiment, a series of pins 235 are mounted on the second surface 318 of the PCB 310. Two of the pins 235 may be used, in an embodiment, to deliver power from a power supply such as a battery pack. These pins may be coupled to the drain of the high-side switches 322 and the sources of the low-side switches 324 via conductive tracks in the PCB 310. Other pins 235 may also be used to communicate with the power supply and/or other power tool components. These pins may be used, for example, to communicate battery sensed voltage, battery temperature, tool temperature, and LED control to and from the controller 230.

In an embodiment, the positional sensors 238 (i.e., Hall sensors) are provided around the through-hole 312. The positional sensors 238 may be provided within the control portion 340 at close radial proximity to the through-hole 312 (e.g., approximately 1-3 mm) and at an angular distance of approximately 60 degrees from one another. These positional sensors 238 are electrically coupled to the controller 230 to provide positional information of the rotor to the controller 230.

In an embodiment, in many power tool applications within the voltage range of 10-60V as described above, high-side and low-side switches 322 may be relatively small FETs with very low Rds-ON (drain-to-source resistance in saturation) and very low junction-to-tab thermal resistance. Thus the FETs generate low heat and transfer the heat quickly to the PCB 310. Accordingly, a relatively small heat sink is sufficient to efficiently transfer heat away from the FETs without sacrificing the module size and performance.

Figure 9:
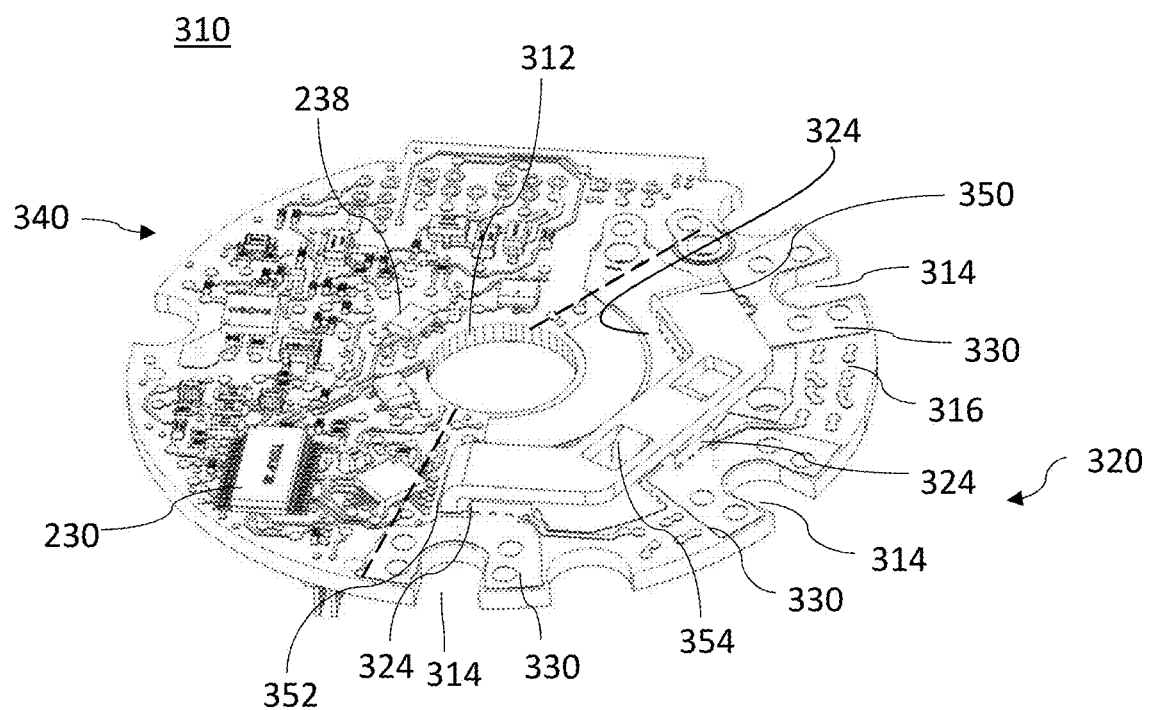
FIG. 9 depicts a perspective view of the PCB with a primary heat sink mounted on its first surface, according to an embodiment.

In an embodiment, as shown in the perspective view of FIG. 9, a primary heat sink 350 is surface-mounted on the first surface 316 of the PCB 310 substantially covering the high-side switches 324. Primary heat sink 350 may include a generally U-shaped planar main body (in this example including three rectangular sub-portions arranged at approximately 120 degree angles) having two outer legs 352 bend downwardly from the ends of the main body and two inner legs 354 stamped through the main body. The legs 352 and 354 are mounted on the top surface 316 of the PCB 310 adjacent the high-side switches 324, holding the primary heat sink 350 main body directly above the high-side switches 324, in contact with or at a close distance thereto. This allows heat to be transferred with very low thermal resistance network from the high-side switches 324 to the primary heat sink 350. In an embodiment, the legs 352 and 354 of the primary heat sink 350 may be secured to one or more conductive tracks on the PCB 310 that are electrically coupled to the drains of the high-side switches 324 for improved heat transfer from the high-side switches 324.

Figure 10A:
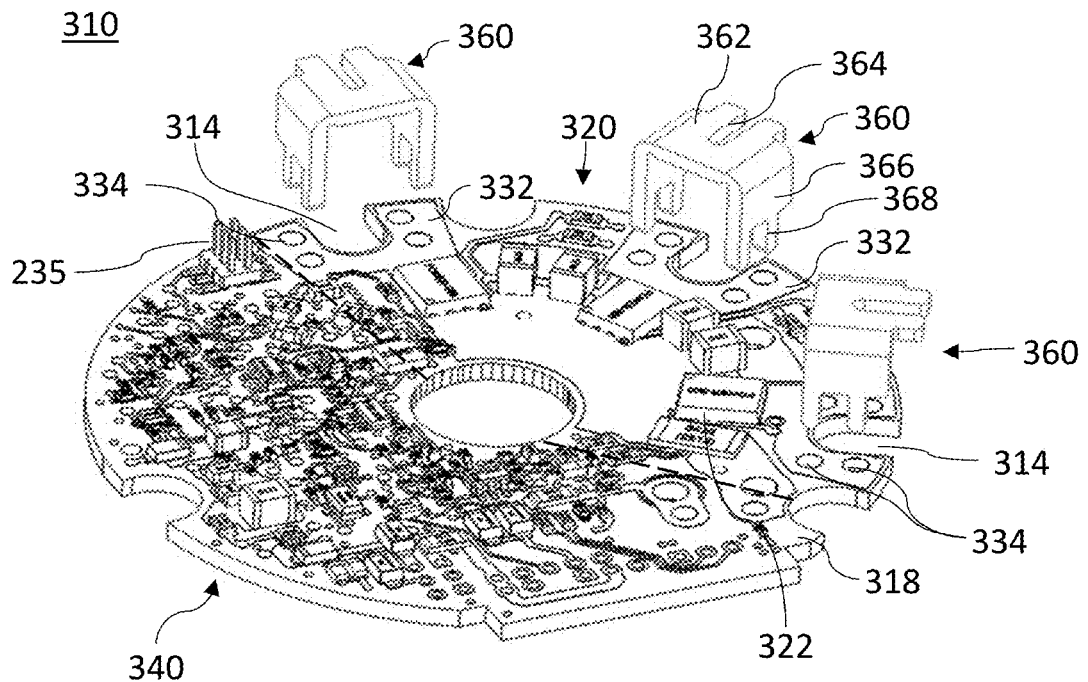
FIGS. 10A and 10B depict perspective views of the PCB with power terminals secured on its second surface, according to an embodiment.
Figure 10B:
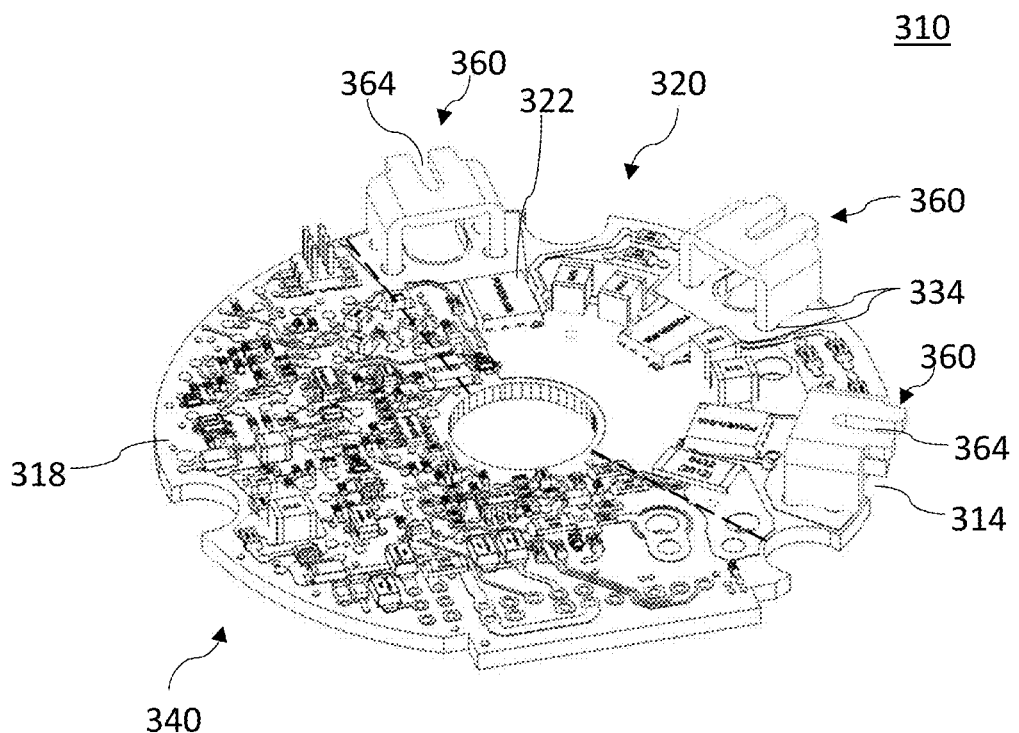

In an embodiment, as shown in the perspective views of FIGS. 10A and 10B, power terminals 360 are inserted into through-holes 332 around the slots 314 on the second surface 318 of the PCB 310. In an embodiment, each power terminal 360 includes a generally U-shaped longitudinal profile with a planar upper portion 362 and two side portions 366 extending approximately perpendicularly from the upper portion 362. The upper portions 362 include radial peripheral slots 364 that align with slots 314 of the PCB 310. Slots 364 of the power terminals 360 are designed and arranged to form-fittingly receive motor terminals 104 therein. Thus, in an embodiment, power terminals 360 are arranged at an angular distance of approximately 60 degrees apart.

In an embodiment, each side portion 366 of the power terminals 360 includes two legs 368 that is received into the through-holes 334 and crimped on the first surface 316 of the PCB 310. These legs 368 make electrical contact with first and second conductive tracks 330 and 332, transferring heat away from the low-side switches 324.

Figure 11:
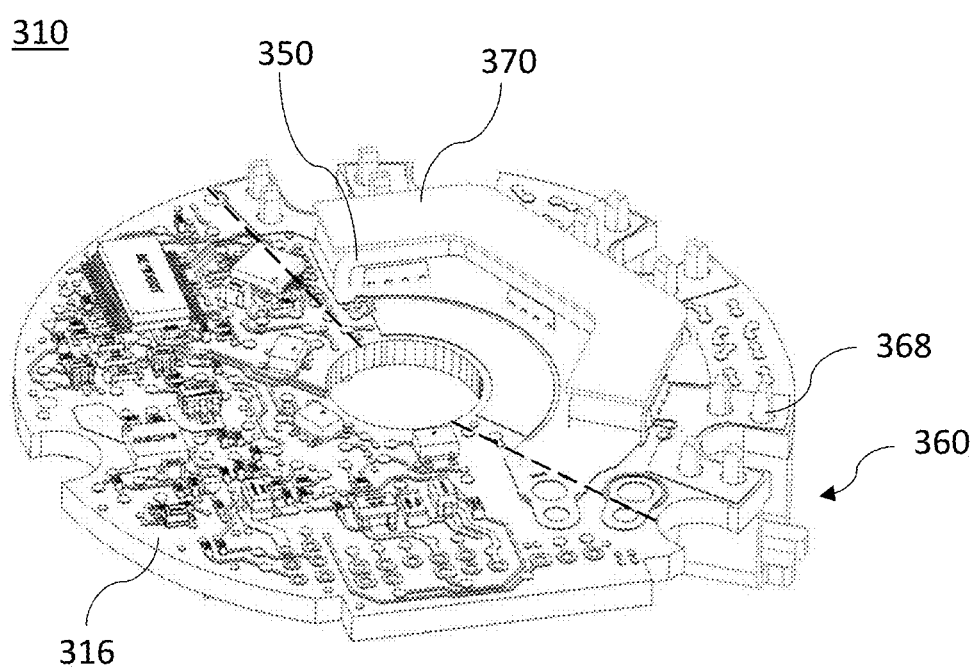
FIG. 11 depicts a perspective view of the PCB with an electrically-isolating thermally-conductive gap pad disposed on the primary heat sink, according to an embodiment.

In an embodiment, as shown in FIG. 11, an electrically-isolating thermally-conductive gap pad 370 is provided over primary heat sink 350. In an embodiment, gap pad 370 is provided with the same general upper-surface shape as the upper surface of the primary heat sink 350. As explained below, this gap pad 370 transfers heat away from the primary heat sink 350 to a larger secondary heat sink.

Figure 12A:
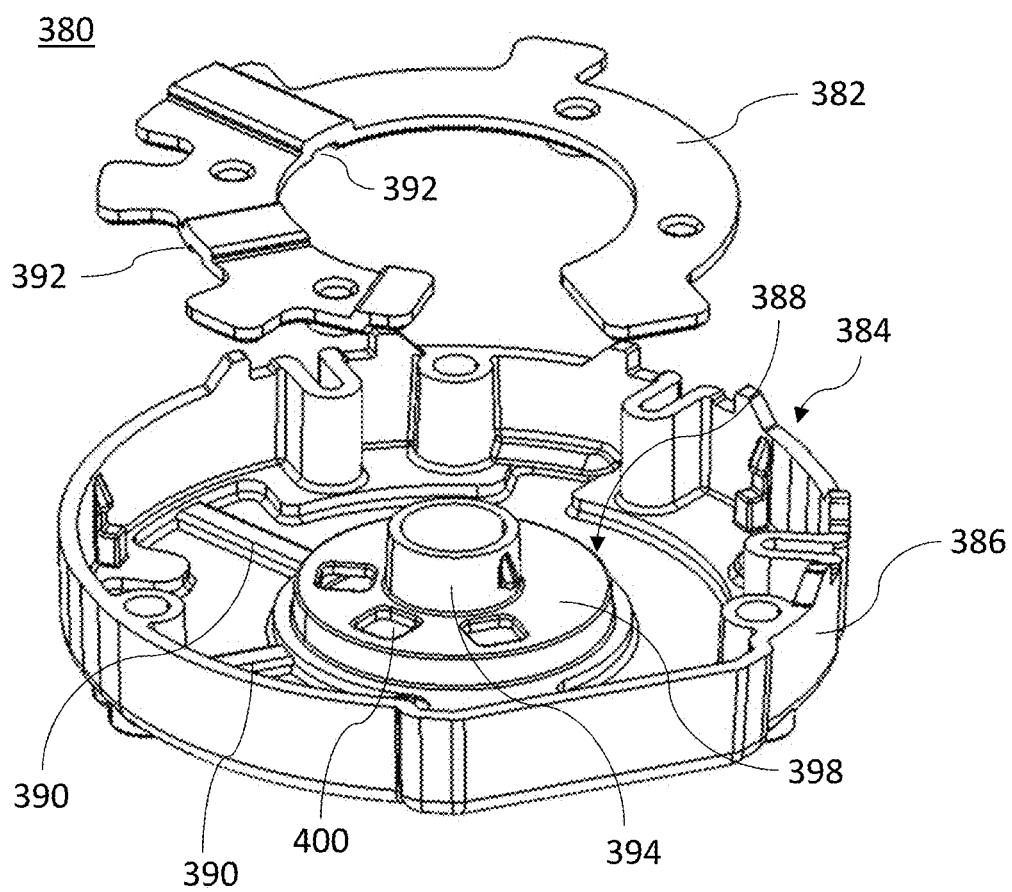
FIGS. 12A-12C depict various views of the module housing of the combined control and power module, according to an embodiment.
Figure 12B:
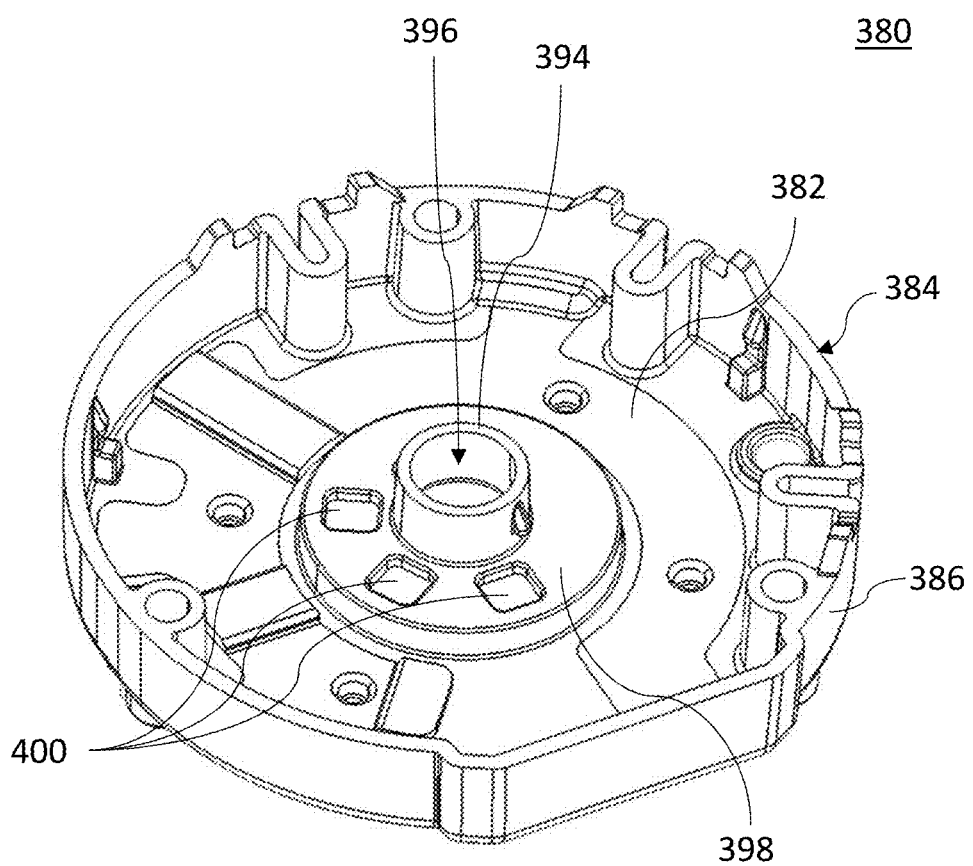
Figure 12C:
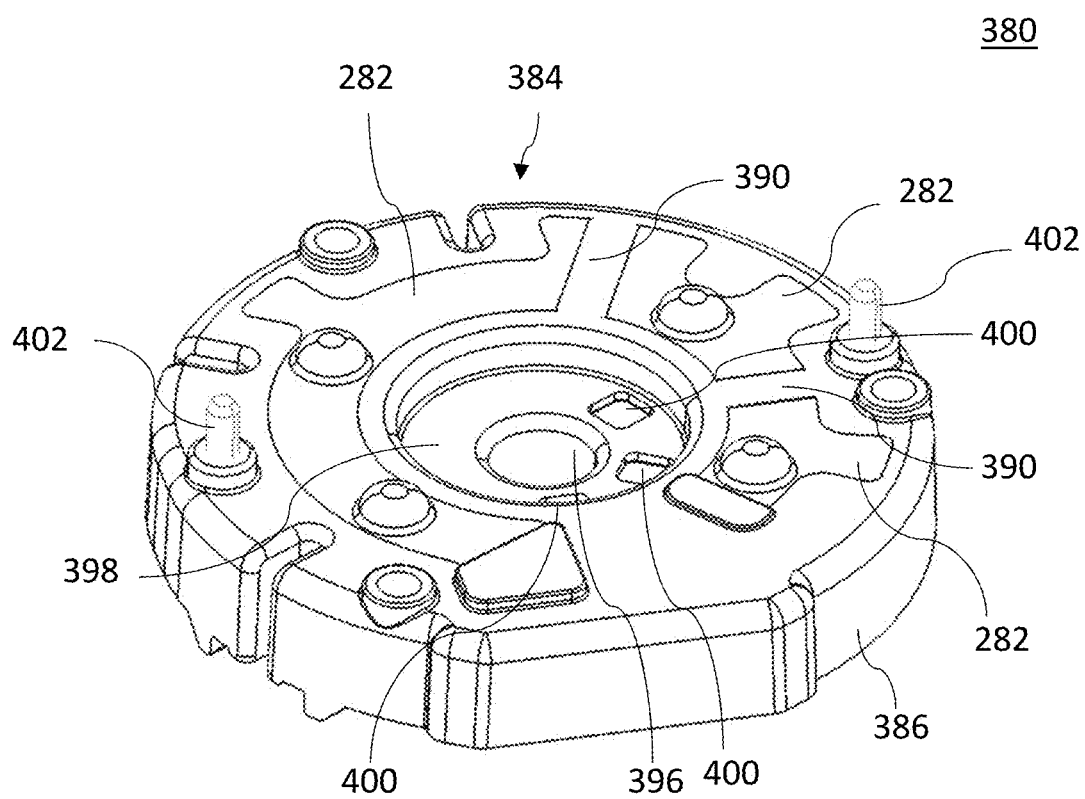

Referring to perspective top views of FIGS. 12A and 12B, and the perspective bottom view of FIG. 12C, a module housing 380 of combined control and power module 300 is described herein, according to an embodiment. In an embodiment, module housing 380 includes a secondary heat sink 382 and a casing 384 molded around the secondary heat sink 382 as shown in these figures. In an embodiment, secondary heat sink 382 includes a ring-shaped or C-shaped profile with a greater surface area than primary heat sink 350. In an embodiment, secondary heat sink 382 has a surface area that is 2 to 4 times greater than primary heat sink 350. The size, shape, surface area, and thickness of heat sink 350 may be adapted based on the power tool output requirements and the characteristics of the power switches. For example, larger FETs for higher-power applications may require a larger secondary heat sink 382.

In an embodiment, casing 384 is molded (i.e., via insert-molding, injection-molding, or any other known molding method) around the secondary heat sink 382 to form a housing for the PCB 310. Alternatively, casing 383 may be provided as a separate part and later assembled with the secondary heat sink 382. In an embodiment, casing 384 includes a ring-shaped outer wall 386 and a middle portion 388 connected to the outer wall 386 via one or more radial bridges 390. Secondary heat sink 382 includes one or more channels 392 within which bridges 390 are formed during the molding process. In this arrangement, the two surfaces of the secondary heat sink 382 are substantially uncovered by the casing 384.

In an embodiment, middle portion 388 of the casing 384 includes a ring-shaped longitudinal inner wall 394 defining a through-hole 396 therein in the center of the casing 384. Extending radially from the inner wall 394 is a disc-shaped planar portion 398 from which the radial bridges 390 extend out to the outer wall 386. In an embodiment, planar portion 398 is formed secondary heat sink 382 is formed inside the circular body of the secondary heat sink 382. In an embodiment, planar portion 398 includes a series of longitudinal openings 400 (in this case three openings), which, as explained below, receives the positional sensors 238 therein.

In an embodiment, the outer wall 386 includes a series of peripheral channels 401 formed via a series of depressions 403 inwardly-projecting from the outer wall 386 towards the inner wall 394. Peripheral channels 401 correspond to and align with slots 314 of the PCB 310. When assembled, as explained below, depressions 403 and the outer wall 384 form a continuous wall within the slots 314 while the peripheral channels 401 provide a path for motor terminals 104 to be received within slots 364 of power terminals 360.

In an embodiment, as shown in FIG. 12C, one or more locating pins 402 are secured to the casing 382. In an embodiment, locating pins 402 mate with corresponding holes in the motor housing 29 for proper alignment of the combined control and power module 300 with the motor 28.

Figure 13A:
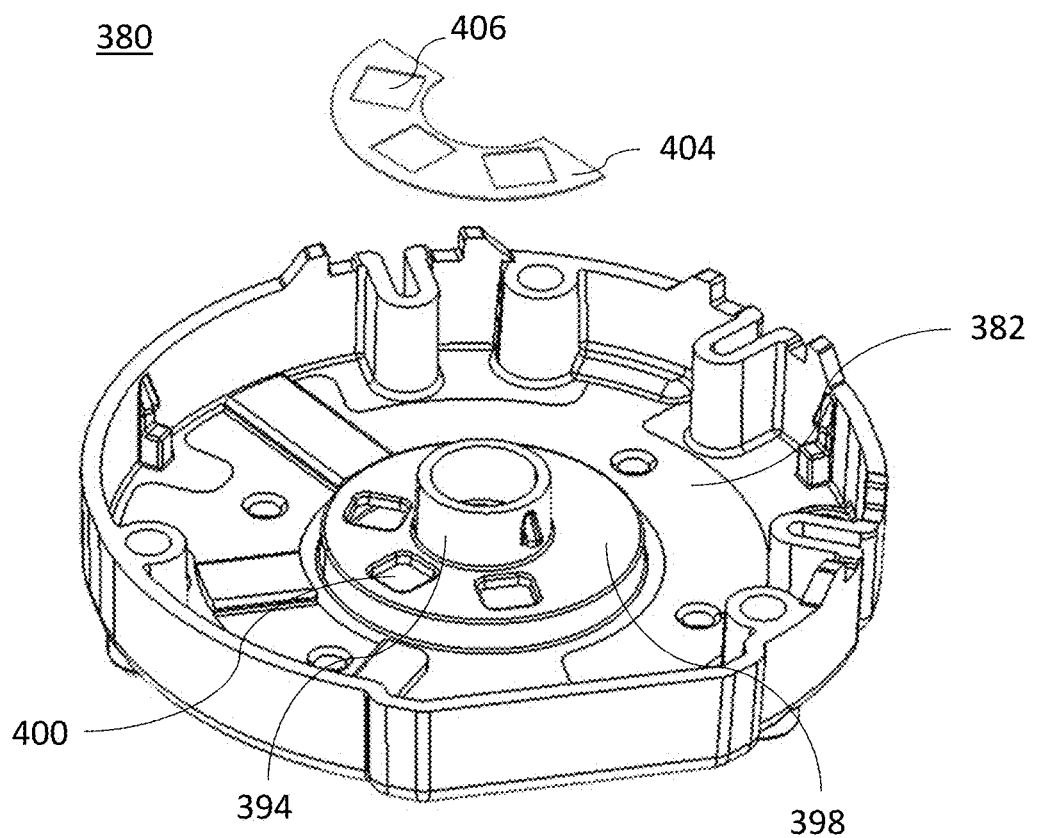
FIGS. 13A and 13B depict top views of the module housing provided with a gasket for sealing the outer perimeter of the module housing openings, according to an embodiment.
Figure 13B:
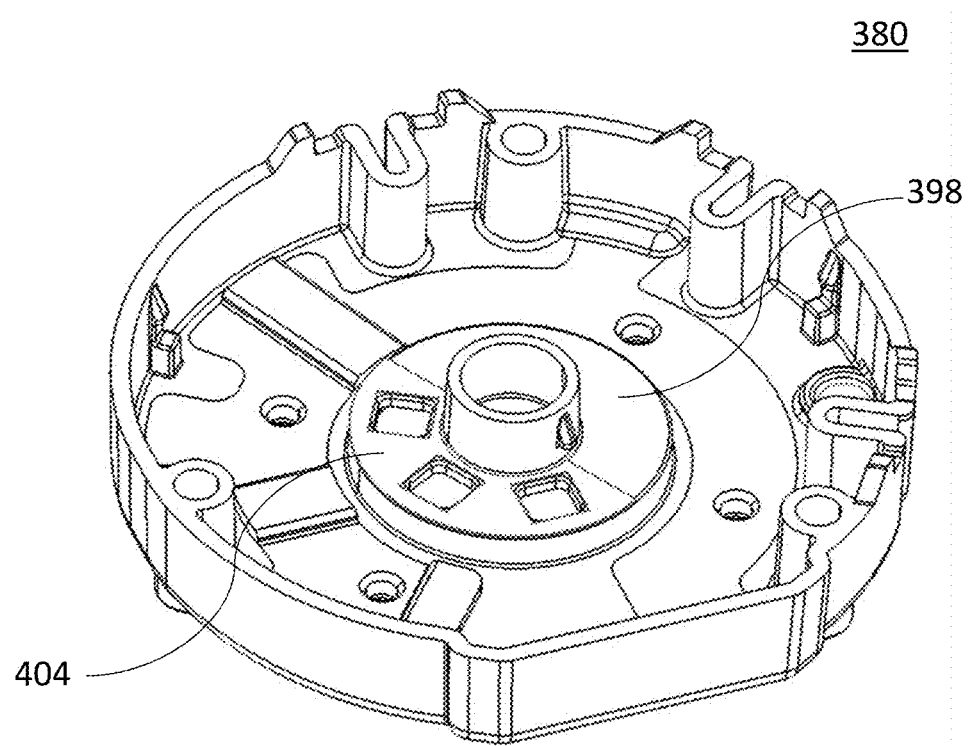

In an embodiment, as shown in FIGS. 13A and 13B, a gasket 404 is provided for sealing the outer perimeter of the openings 400 during the potting process, as described below in detail. In an embodiment, gasket 404 includes a series of openings 406 corresponding to openings 400 of the casing 382.

Figure 14:
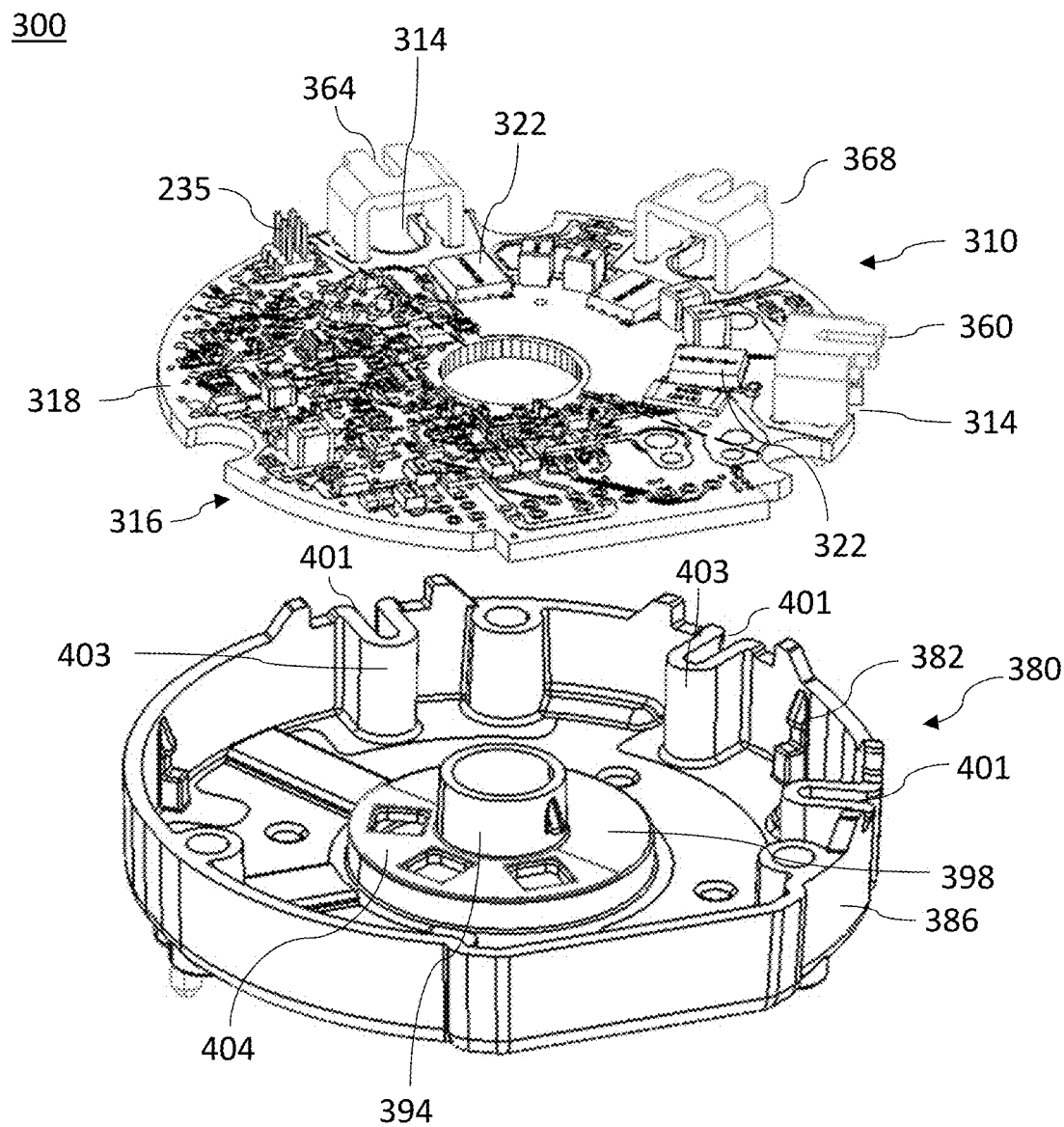
FIG. 14 depicts an exploded view of the combined control and power module, according to an embodiment.

FIG. 14 provides an exploded view of the combined control and power module 300, showing PCB 310 prior to assembly inside module housing 380. In an embodiment, the first surface 316 of the PCB 310 faces the module housing 380 such that the primary heat sink 350 (and thermally-conductive gap pad 370) rest on top of the secondary heat sink 382 when fully assembled.

Figure 15A:
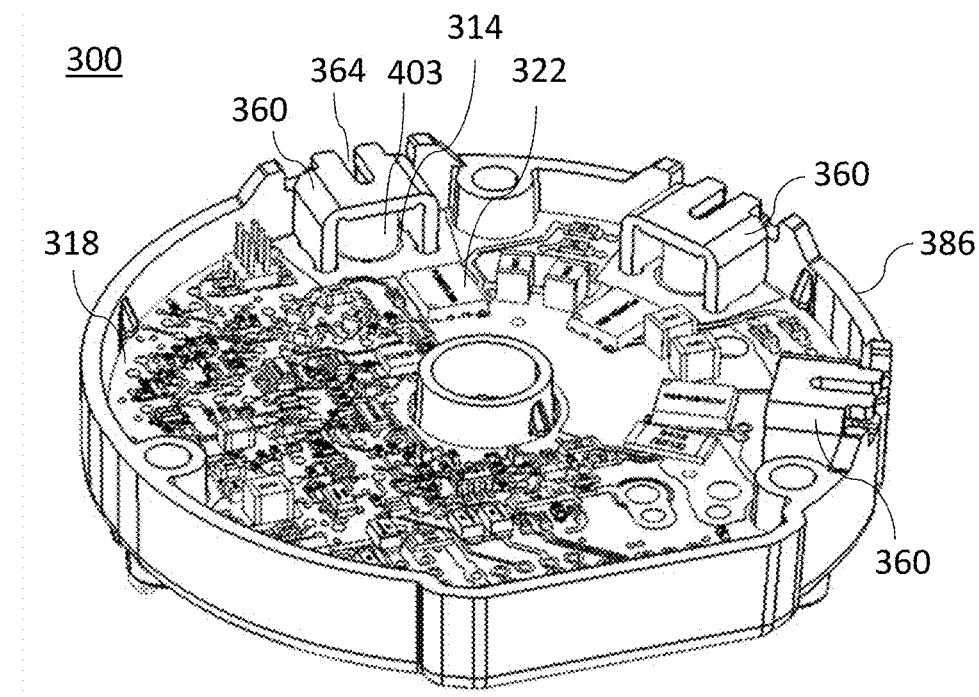
FIGS. 15A and 15B depict top and bottom assembled views of the combined control and power module, according to an embodiment.
Figure 15B:
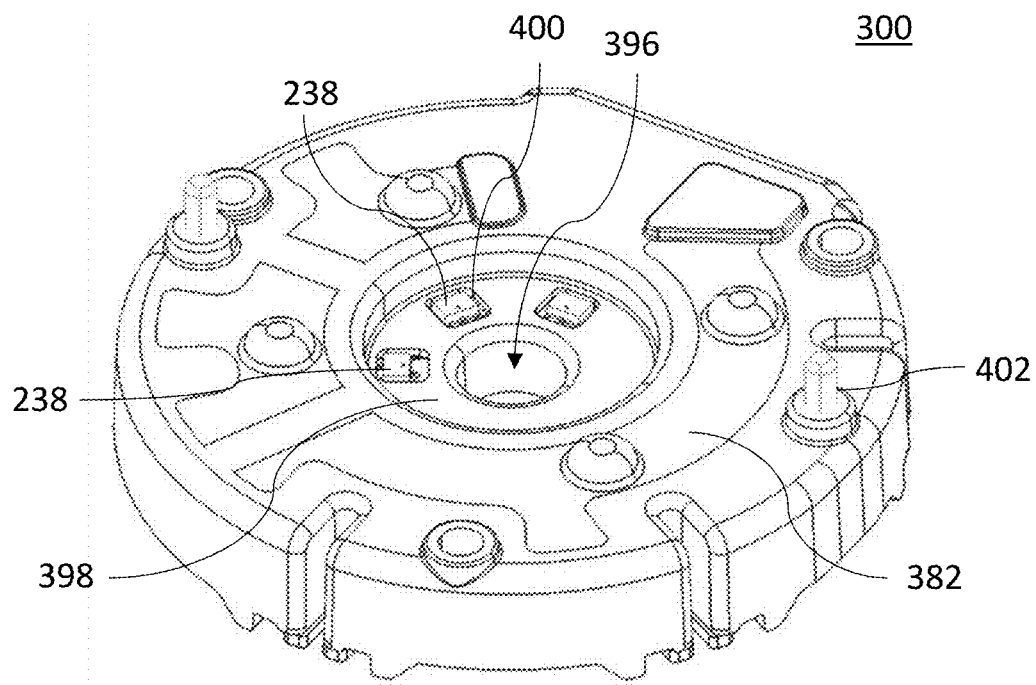

FIGS. 15A and 15B depict top and bottom assembled views of the combined control and power module 300, showing PCB 310 after assembly inside module housing 380, according to an embodiment. In an embodiment, when fully inserted, depressions 403 of the outer wall 386 are received within slots 314 of the PCB 310 such that motor terminals 360 are positioned above the depressions 403 in contact with or at a close distance thereto, with slots 364 of the motor terminals 360 aligning with peripheral channels 401 of the outer wall 386. Also, when fully inserted, the first surface 316 of PCB 310 rests partially on the gasket 404, and positional sensors 238 of PCB 310 are received within openings 400 of the planar portion 398 of the module housing 380.

Figure 16:
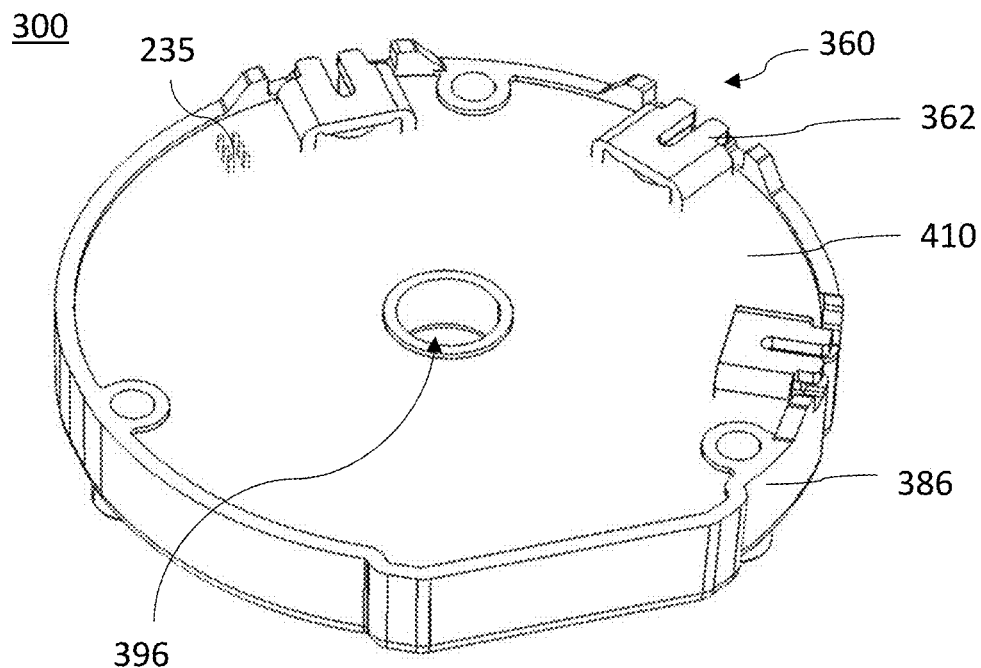
FIG. 16 depicts a top perspective view of the combined control and power module with a potting combined applied, according to an embodiment.
Figure 17:
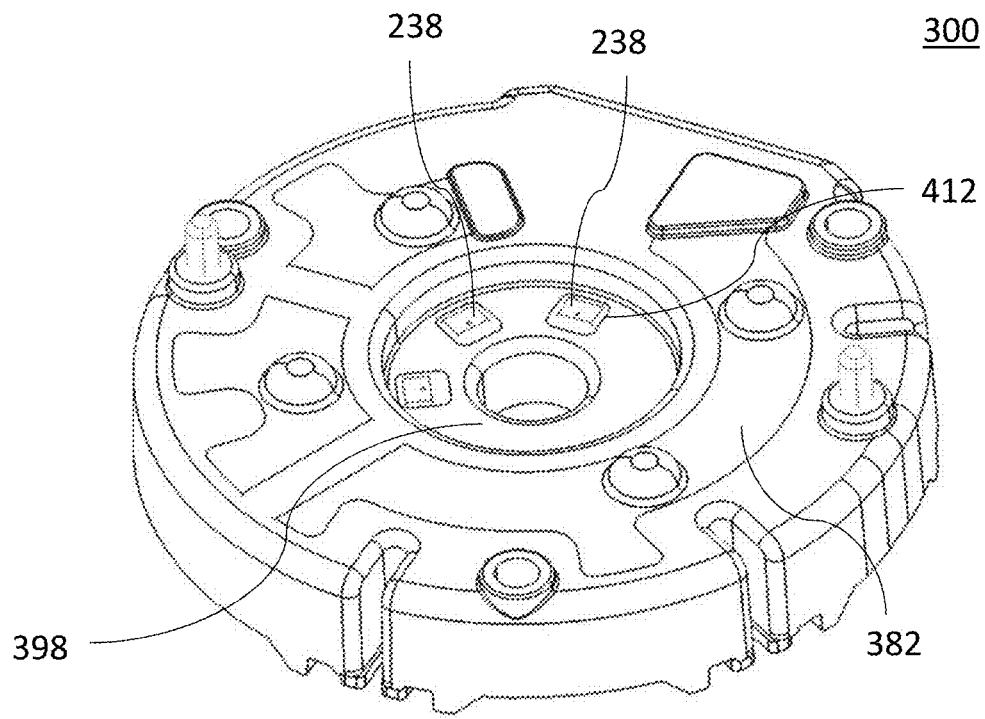
FIG. 17 depicts a bottom perspective view of the combined control and power module with an adhesive applied to the housing openings, according to an embodiment.

In an embodiment, in order to seal the electronic components described herein from contamination, the module housing 380 is potted via a potting compound 410, as shown in FIG. 16. The potting compound 410 flows through gaps between the PCB 310 and the outer wall 386 to fill the underside of the PCB 310. Gasket 404 prevents flow of the potting compound 410 around the positional sensors 238. In an embodiment, the potting compound covers substantially both surfaces of the PCB 310, but leaves upper portions 362 of motor terminals 360 substantially exposed. In an embodiment, pins 235 also project out of the potting compound 410. In an embodiment, as shown in FIG. 17, adhesive 412 is applied to openings 400 to cover the positional sensors 238.

The embodiments described above provides many advantages over conventional designs, where the positional sensors, power components, and control components are provided in different modules. Since the positional sensors, control components, and power components are all provided on the same PCB, and routed together via metal routings on or through the PCB layers, there is no longer a need to wire these components together within the power tool. This substantially easier the assembly process and reduces costs. Also, since the module heat sink (i.e., secondary heat sink 382) is positioned adjacent and facing the motor 28, substantial air flow generated by the motor fan 60 passes over the module heat sink, transferring significant amount of heat away from the power components.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The invention claimed is:

1. An electronic module for a power tool having an electric motor, comprising: a printed circuit board (PCB) being substantially disc-shaped and including a first surface and a second surface, the PCB comprising a plurality of peripheral slots recessed radially inward from a periphery of the PCB, the plurality of peripheral slots being positioned to allow passage of a plurality of motor terminals from the electric motor there through along an axial direction of the electric motor; a first plurality of power switches mounted on the first surface of the PCB; a second plurality of power switches mounted on either the first surface or the second surface of the PCB and electrically coupled to the first plurality of power switches forming an inverter bridge circuit for driving the electric motor; a plurality of positional sensors mounted on the first surface of the PCB substantially equidistantly from a center of the PCB; and a plurality of power terminals mounted on the second surface of the PCB, each power terminal having a planar upper portion disposed at a distance from the second surface of the PCB and a plurality of legs extending from the planer upper portion and mounted over the second surface of the PCB around a corresponding one of the plurality of peripheral slots, wherein the planar upper portions of the plurality of power terminals include receiving slots having widths that are smaller than widths of the plurality of peripheral slots of the PCB and sized to slidingly receive and make electrical contact with the plurality of motor terminals passing through the plurality of peripheral slots of the PCB to electrically connect the inverter bridge circuit to the electric motor.

2. The electronic module of claim 1, further comprising a controller mounted on the first surface of the PCB, the controller being in communication with the plurality of positional sensors to receiving positional signals related to a rotational position of the electric motor.

3. The electronic module of claim 1, further comprising a heat sink having legs mounted on the first surface of the PCB and having a planar main body extending from the legs substantially in parallel to the of the PCB over the first plurality of power switches.

4. The electronic module of claim 1, wherein the respective ones of the first plurality of power switches are disposed equidistantly at an angular distance of approximately 60 degrees apart.

5. The electronic module of claim 4 wherein the plurality of power terminals are disposed radially-outwardly of the first plurality of power switches at an angular distance of approximately 60 degrees apart.

6. The electronic module of claim 1, further comprising a module housing arranged to receive the PCB therein, the module housing including a planar portion in parallel to the PCB and a plurality of openings disposed in the planar portion angularly around a center of the module housing to receive the plurality of positional sensors therein.

7. The electronic module of claim 6, further comprising a gasket disposed between the planar portion of the module housing and the first surface of the PCB, the gasket being arranged to seal the outer perimeters of the plurality of openings.

8. The electronic module of claim 6, wherein the module housing comprises a heat sink in thermal communication with the first plurality of power switches, the heat sink being disposed along the planar portion of the module housing so as to be exposed on an outer surface of the module housing facing the motor.

9. The electronic module of claim 8, wherein the heat sink includes a ring-shaped or a C-shaped profile.

10. The electronic module of claim 6, further comprising a potting compound that substantially covers both surfaces of the PCB within the module housing.

11. A power tool comprising: a housing arranged to house the electric motor; and the electronic module of claim 1 disposed within the housing adjacent the motor.

12. An electronic module for a power tool having an electric motor, comprising: a printed circuit board (PCB) being substantially disc-shaped and including a first surface and a second surface, the PCB comprising a plurality of peripheral slots recessed radially inward from a periphery of the PCB, the plurality of peripheral slots being positioned to allow passage of a plurality of motor terminals from the electric motor there through along an axial direction of the electric motor; a plurality of power switches mounted on the PCB forming an inverter bridge circuit for driving the electric motor; a plurality of positional sensors mounted on the PCB facing the electric motor substantially equidistantly from a center of the PCB; a plurality of power terminals mounted on the second surface of the PCB, each power terminal having a planar upper portion disposed at a distance from the second surface of the PCB and a plurality of legs extending from the planer upper portion and mounted over the second surface of the PCB around a corresponding one of the plurality of peripheral slots, wherein the planar upper portions of the plurality of power terminals includes receiving slots having widths that are smaller than widths of the plurality of peripheral slots of the PCB and sized to slidingly receive and make electrical contact with the plurality of motor terminals passing through the plurality of peripheral slots of the PCB to electrically connect the inverter bridge circuit to the electric motor; and a module housing arranged to receive the PCB therein, the module housing including a ring-shaped outer wall, a planar portion in parallel to the PCB, and a plurality of openings disposed in the planar portion angularly around a center of the module housing to receive the plurality of positional sensors therein, and a heat sink extending between the outer wall and the planar portion.

13. The electronic module of claim 12, further comprising a first heat sink mounted on the PCB in thermal communication with at least one of the plurality of power switches.

14. The electronic module of claim 13, further comprising a second heat sink secured to the module housing in thermal communication with the first heat sink to transfer heat from the at least one of the plurality of power switches in the direction of the electric motor.

15. A power tool comprising: a housing arranged to house the electric motor; and the electronic module of claim 12 disposed within the housing adjacent the motor.

16. The electronic module of claim 13, wherein the first heat sink is in physical contact with the second heat sink and the second heat sink includes a substantially planar C-shaped or ring-shaped body.

17. The electronic module of claim 12, further comprising a controller mounted on the PCB and configured to control a switching operation of the plurality of power switches.

18. An electronic module for a power tool having an electric motor, comprising: a printed circuit board (PCB) being substantially disc-shaped and including a first surface and a second surface, the PCB comprising a plurality of peripheral slots recessed radially inwardly from a periphery of the PCB, the plurality of peripheral slots being positioned to allow passage of a plurality of motor terminals from the electric motor there through along an axial direction of the electric motor; a first plurality of power switches mounted on the first surface of the PCB; a second plurality of power switches mounted on either the first surface or the second surface of the PCB and electrically coupled to the first plurality of power switches forming an inverter bridge circuit for driving the electric motor; a plurality of positional sensors mounted on the first surface of the PCB substantially equidistantly from a center of the PCB; and a plurality of power terminals mounted on the second surface of the PCB, each power terminal having a planar upper portion disposed at a distance from the second surface of the PCB and a plurality of legs extending from the planer upper portion and mounted over the second surface of the PCB around a corresponding one of the plurality of peripheral slots, wherein the planar upper portions of the plurality of power terminals make electrical contact with the plurality of motor terminals passing through the plurality of peripheral slots of the PCB to electrically connect the inverter bridge circuit to the electric motor, wherein the respective ones of the first plurality of power switches are disposed equidistantly at an angular distance of approximately 60 degrees apart and the plurality of power terminals are disposed radially-outwardly of the first plurality of power switches at an angular distance of approximately 60 degrees apart.

\* \* \* \* \*